United States Patent
Zhang et al.

(10) Patent No.: US 11,650,292 B2
(45) Date of Patent: May 16, 2023

(54) TIME OF FLIGHT ASSEMBLY FOR CONTROLLING LASER LIGHT SOURCE TO BE TURNED OFF, TERMINAL DEVICE AND CONTROL METHOD FOR TIME OF FLIGHT ASSEMBLY

(71) Applicant: GUANGDONG OPPO MOBILE TELECOMMUNICATIONS CORP., LTD., Guangdong (CN)

(72) Inventors: Wei Zhang, Guangdong (CN); Biao Chen, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 569 days.

(21) Appl. No.: 16/726,608

(22) Filed: Dec. 24, 2019

(65) Prior Publication Data
US 2020/0309909 A1  Oct. 1, 2020

(30) Foreign Application Priority Data

Mar. 25, 2019 (CN) .......................... 201910229451.5

(51) Int. Cl.
*G01S 7/481* (2006.01)
*G01B 11/22* (2006.01)
(Continued)

(52) U.S. Cl.
CPC .............. *G01S 7/481* (2013.01); *G01B 11/22* (2013.01); *G01S 17/08* (2013.01); *H04B 10/50* (2013.01);
(Continued)

(58) Field of Classification Search
None
See application file for complete search history.

(56) References Cited

U.S. PATENT DOCUMENTS

2006/0103835 A1 * 5/2006 Artsyukhovich .... G02B 6/4284
356/73.1
2009/0084857 A1 * 4/2009 Silverbrook ........... G06Q 30/02
235/472.01
(Continued)

FOREIGN PATENT DOCUMENTS

CN  102933934 A  2/2013
CN  103197321 A  7/2013
(Continued)

OTHER PUBLICATIONS

Second Office Action of the Chinese application No. 201910229451.5, dated Mar. 16, 2021.
(Continued)

*Primary Examiner* — Edemio Navas, Jr.

(57) ABSTRACT

A time of flight (TOF) assembly includes a laser light source, one or more photo detectors and a detection circuit. The one or more photo detectors are configured to receive light and convert the received light into an electric signal. The detection circuit is configured to send a turning-off control signal to turn off the laser light source in response to the electric signal indicating that a time length, in which the laser light source is in an effective working state within a first duration, is greater than a preset time length threshold value or the electric signal indicating that energy of light emitted from the laser light source within a second duration is greater than a preset energy threshold. The disclosure also provides a terminal device and a control method for a TOF assembly.

19 Claims, 18 Drawing Sheets

(51) Int. Cl.
*G01S 17/08* (2006.01)
*H04B 10/50* (2013.01)
*H04M 1/26* (2006.01)
*H04M 1/27* (2006.01)
*H04M 1/02* (2006.01)

(52) U.S. Cl.
CPC ....... *H04M 1/0264* (2013.01); *H04M 1/0277* (2013.01)

(56) References Cited

U.S. PATENT DOCUMENTS

| | | | | |
|---|---|---|---|---|
| 2011/0181704 | A1* | 7/2011 | Gordon | G06T 7/521 348/46 |
| 2012/0075615 | A1* | 3/2012 | Niclass | G01S 7/489 356/5.01 |
| 2014/0185643 | A1* | 7/2014 | McComb | H01S 3/06754 372/75 |
| 2016/0282177 | A1* | 9/2016 | Heinonen | G01S 17/00 |
| 2017/0179359 | A1* | 6/2017 | Lunz | F21V 29/70 |
| 2017/0356981 | A1 | 12/2017 | Yang et al. | |
| 2018/0292514 | A1 | 10/2018 | Yoshino | |
| 2018/0329035 | A1* | 11/2018 | Pacala | G01S 7/4865 |
| 2018/0364340 | A1* | 12/2018 | Ichiyanagi | G01S 7/4814 |
| 2019/0124748 | A1* | 4/2019 | Dielacher | H05B 45/12 |
| 2020/0052466 | A1 | 2/2020 | Chen et al. | |
| 2020/0271831 | A1* | 8/2020 | Ge | G02B 5/005 |

FOREIGN PATENT DOCUMENTS

| | | |
|---|---|---|
| CN | 103592026 A | 2/2014 |
| CN | 105120022 A | 12/2015 |
| CN | 107706703 A | 2/2018 |
| CN | 108072879 A | 5/2018 |
| CN | 108267749 A | 7/2018 |
| CN | 108539575 A | 9/2018 |
| CN | 108711734 A | 10/2018 |
| CN | 208013431 U | 10/2018 |
| CN | 108767654 A | 11/2018 |
| CN | 108769646 A | 11/2018 |
| CN | 108828829 A | 11/2018 |
| CN | 109059797 A | 12/2018 |
| CN | 109151271 A | 1/2019 |
| CN | 109286126 A | 1/2019 |
| CN | 208399674 U | 1/2019 |
| CN | 109901184 A | 6/2019 |
| DE | 102017207956 A1 | 11/2017 |
| JP | H0552957 A | 3/1993 |
| JP | H07260937 A | 10/1995 |
| JP | H0815414 A | 1/1996 |
| JP | H1031064 A | 2/1998 |
| JP | 2009258089 A | 11/2009 |
| JP | 2012093256 A | 5/2012 |
| JP | 2019012668 A | 1/2019 |
| KR | 20160132962 A | 11/2016 |
| WO | 2018156412 A1 | 8/2018 |

OTHER PUBLICATIONS

First Office Action of the European application No. 20152123.4, dated Mar. 23, 2021.
Office Action of the Indian application No. 202014012226, dated May 25, 2021.
European Search Report in the European application No. 20152123.4, dated Mar. 25, 2020.
First Office Action of the Chinese application No. 201910229451.5, dated Jun. 10, 2020.
International Search Report in the international application No. PCT/CN2020/079588, dated Jun. 22, 2020.
Written Opinion of the International Search Authority in the international application No. PCT/CN2020/079588, dated Jun. 22, 2020.
Third Office Action of the Chinese application No. 201910229451.5, dated Jun. 25, 2021.
A.H.Dogar et.al, "Langmuir Probe Measurements of Nd-YAG Laser-Produced Copper Plasmas", IEEE Transactions on Plasma Science, vol. 39, No. 3, Mar. 31, 2011.
Miao Yu, "Research on Scanning Imaging Ladar System", China Excellent Master degree Thesis Full-text Database (doctor) Information Materials and Technology Series, No. 04, Apr. 15, 2015.
Notice of Allowance of the Chinese application No. 201910229451.5, dated Sep. 22, 2021.
Second Office Action of the European application No. 20152123.4, dated Sep. 22, 2021.
First Office Action of the Japanese application No. 2021-542449, dated Aug. 16, 2022.
Second Office Action of the Japanese application No. 2021-542449, dated Dec. 23, 2022.
First Office Action of the Korean application No. 10-2021-7022737, dated Dec. 28, 2022.

* cited by examiner

TIME OF FLIGHT ASSEMBLY FOR CONTROLLING LASER LIGHT SOURCE TO BE TURNED OFF, TERMINAL DEVICE AND CONTROL METHOD FOR TIME OF FLIGHT ASSEMBLY

CROSS-REFERENCE TO RELATED APPLICATIONS

The present application claims benefit of Chinese Application No. 201910229451.5, filed on Mar. 25, 2019, the contents of which are hereby incorporated by reference in its entirety.

TECHNICAL FIELD

The disclosure relates to the technical field of consumer electronics, and more particularly to a time of flight (TOF) assembly, a terminal device and a control method for a TOF assembly.

BACKGROUND

A depth acquisition device may be configured in a mobile phone. A depth acquisition device may acquire a depth of a target object by use of a TOF technology. A specific manner includes: controlling a light source to emit laser to the target object, then receiving laser reflected by the target object and calculating a time required by a process that the laser is emitted from the mobile phone to the target object and returned to the mobile phone from the target object to acquire the depth of the target object. When the depth acquisition device works abnormally, the laser is likely to hurt a user, and thus the depth acquisition device is not so safe in use.

BRIEF DESCRIPTION OF DRAWINGS

The abovementioned and/or additional aspects and advantages of the disclosure will become apparent and easy to understand from the descriptions made to the implementations below in combination with the drawings.

Figure 1:
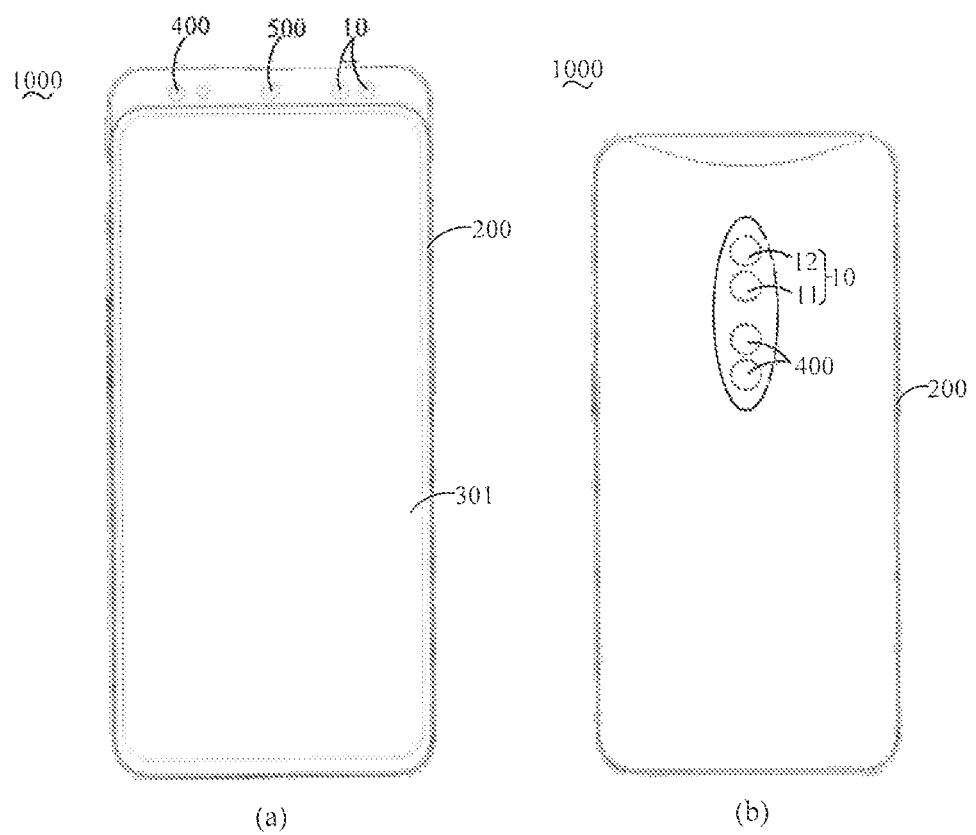
FIG. 1 illustrates a diagram of a terminal device according to an implementation of the disclosure.

LIST OF REFERENCE SIGNS 1000 terminal device 1000
100 TOF assembly
10 TOF module
11 light emitter
111 laser light source
112 optical element
113 emission housing
114 receiving cavity
115 light outlet
116 light absorption layer
117 light reflection layer
118 light condensing mechanism
119 driving mechanism
12 light receiver
121 lens
122 sensor
1221 control module
13 substrate
14 light filter member
20 control system
21 photo detector
22 detection circuit
23 driving circuit
24 application processor (AP)
25 modulation module
26 power module
200 shell
300 signal generator
301 display screen
400 distance detector
500 light detector 500
600 cover plate

DETAILED DESCRIPTION

The implementations of the disclosure will further be described below in combination with the drawings. The same or similar reference signs in the drawings always represent the same or similar components or components with the same or similar functions.

In addition, the implementations of the disclosure described below in combination with the drawings are exemplary and only adopted to explain the implementations of the disclosure and should not be understood as limits to the disclosure.

In the disclosure, unless otherwise specified and limited definitely, the state that a first feature is "above" or "below" a second feature may refer to that the first and second features directly contact or the first and second features indirectly contact through a medium. Moreover, the state that the first feature is "above", "over" and "on" the second feature may refer to that the first feature is over or above the second feature or only indicates that a horizontal height of the first feature is larger than that of the second feature. The state that the first feature is "below", "under" and "beneath" the second feature may refer to that the first feature is under or below the second feature or only indicates that the horizontal height of the first feature is smaller than the horizontal height of the second feature.

Implementations of the disclosure provide a TOF assembly, a terminal device and a control method for a TOF assembly.

A TOF assembly of the implementations of the disclosure may include a laser light source, one or more photo detectors and a detection circuit. The photo detectors may be configured to receive light and convert the received light into an electric signal. The detection circuit may be configured to send a turning-off control signal to turn off the laser light source in response to the electric signal indicating that a time length, in which the laser light source is in an effective working state within a first duration, is greater than a preset time length threshold value or the electric signal indicating that energy of light emitted from the laser light source within a second duration is greater than a preset energy threshold value.

A terminal device of the implementations of the disclosure may include a shell and a TOF assembly of the implementations of the disclosure. The TOF assembly may be mounted in the shell.

A control method for a TOF assembly of the implementations of the disclosure may be applied to control of the TOF assembly. The TOF assembly may include a laser light source and one or more photo detectors, and the photo detectors may be configured to receive light and convert the received light into an electric signal. The method may include that: the electric signal is acquired; it is determined whether the electric signal indicates that a time length, in which the laser light source is in an effective working state within a first duration, is greater than a preset time length threshold value, or it is determined whether the electric signal indicates that energy of light emitted from the laser light source within a second duration is greater than a preset energy threshold value; and in response to the electric signal indicating that the time length is greater than the preset time length threshold value or the electric signal indicating that the energy is greater than the preset energy threshold value, a turning-off control signal is sent to turn off the laser light source.

In the TOF assembly, terminal device and control method for the TOF assembly according to the implementations of the disclosure, when the electric signal indicates that the time length, in which the laser light source is in the effective working state within the first duration is greater than the preset time length threshold value or the electric signal indicates that the energy of the light emitted from the laser light source within the second duration is greater than the preset energy threshold value, the laser light source is turned off, thus hurts to a user can be avoided, and safety in use of the TOF assembly is relatively high.

Additional aspects and advantages of the implementations of the disclosure will be partially presented in the following descriptions and partially become apparent from the following descriptions or get understood by implementing the implementations of the disclosure.

Figure 2:
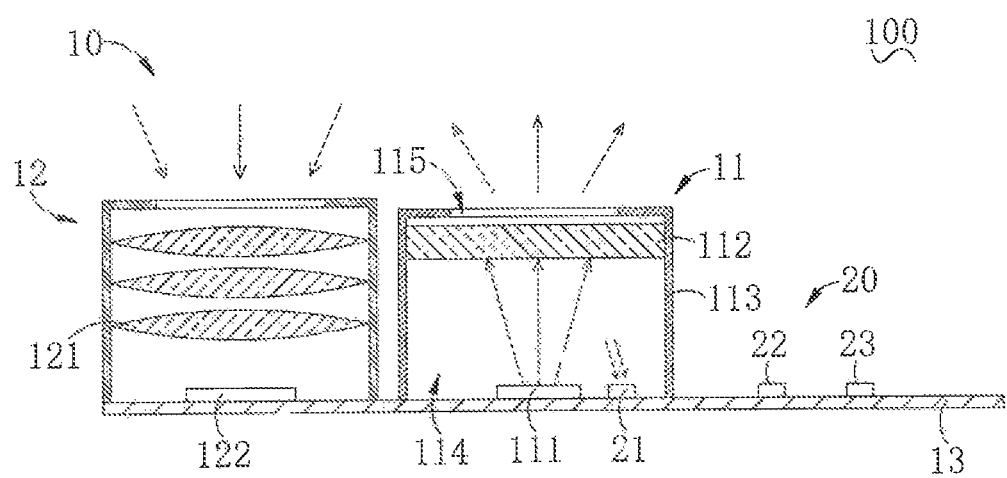
FIG. 2 illustrates a diagram of a TOF module and a control system according to an implementation of the disclosure.

As illustrated in FIG. 1 and FIG. 2, a terminal device 1000 of the implementations of the disclosure includes a TOF assembly 100 and a shell 200. The TOF assembly 100 includes a TOF module 10 and a control system 20. The terminal device 1000 may control the TOF module 10 by use of the control system 20 to acquire depth information of a target object to execute operations of range finding, modeling and the like by use of the depth information. The terminal device 1000 may specifically be a mobile phone, a pad, a remote controller, an intelligent wearable device and the like, and the terminal device 1000 may also be an external device mounted on a mobile platform (for example, an unmanned aerial vehicle and an automobile). Descriptions are made in embodiments of the disclosure with the condition that the terminal device 1000 is a mobile phone as an example. It may be understood that a specific form of the terminal device 1000 is not limited to a mobile phone.

Figure 3:
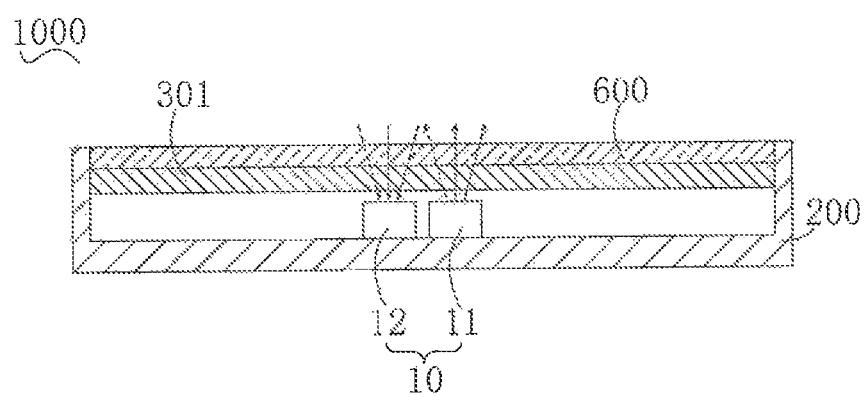
FIG. 3 illustrates a cross-sectional view of a terminal device according to an implementation of the disclosure.

As illustrated in FIG. 1, the TOF module 10 may be mounted in the shell 200. Specifically, in an example, a through hole is formed in the shell 200, the TOF module 10 is mounted in the shell 200 and aligned with the through hole, and the through hole may be formed in a front surface (as shown in FIG. 1a) or back surface (as shown in FIG. 1b) of the shell 200. As illustrated in FIG. 3, in another example, the TOF module 10 is mounted in the shell 200 and aligned with a display screen 301 and a cover plate 600 of the terminal device 1000, namely arranged under the display screen 301 and the cover plate 600, an optical signal emitted by the TOF module 10 enters the outside through the display screen 301 and the cover plate 600, and the optical signal in the outside is transmitted through the cover plate 600 and the display screen 301 and then received by the TOF module 10, the optical signal being represented by the dashed line in FIG. 3.

In combination with FIG. 2, the TOF module 10 includes a light emitter 11 and a light receiver 12. The light emitter 11 and the light receiver 12 may be arranged on the same substrate 13. The light emitter 11 includes a laser light source 111, an optical element 112 and an emission housing 113.

The laser light source 111 may be a Vertical Cavity Surface Emitting Laser (VCSEL), the laser light source 111 may be configured to emit infrared laser, a wavelength of the infrared laser may be 940 nanometers, and the infrared laser may have a uniform light spot pattern.

The optical element 112 may be arranged on a light path of the infrared laser, and the infrared laser emitted by the laser light source 111 is transmitted through the optical element 112 and then enters an external environment. It may be understood that, in an example, when the infrared laser is transmitted through the optical element 112, an optical phenomenon of diffraction, scattering and the like may occur to the infrared laser to change the pattern, propagation direction and the like of the infrared laser. In another example, when the infrared laser is transmitted through the optical element 112, the infrared laser may also be transmitted through the optical element 112 only but the pattern and propagation direction of the infrared laser are not changed. Specifically, descriptions are made in the embodiments of the disclosure with the condition that the optical element 112 is a diffuser as an example. The diffuser is arranged on the light path of the infrared laser, and the infrared laser emitted by the laser light source 111 is diffused by the diffuser for more uniform emission to an external space. In addition, the diffuser 112 may further reflect part of the infrared laser.

The emission housing 113 may be provided with a receiving cavity 114, and both the laser light source 111 and the optical element 112 may be arranged in the receiving cavity 114. The emission housing 113 may be made from a metal material to shield external electromagnetic interference, and the emission housing 113 may also be made from a material such as plastics and a resin. A light outlet 115 may be formed in the emission housing 113, the light outlet 115 is communicated with the receiving cavity 114, the infrared laser emitted by the laser light source 111 is transmitted through the light outlet 115 and then enters the external environment, and of course, light in the external environment may also enter the receiving cavity 114 through the light outlet 115.

Figure 4:
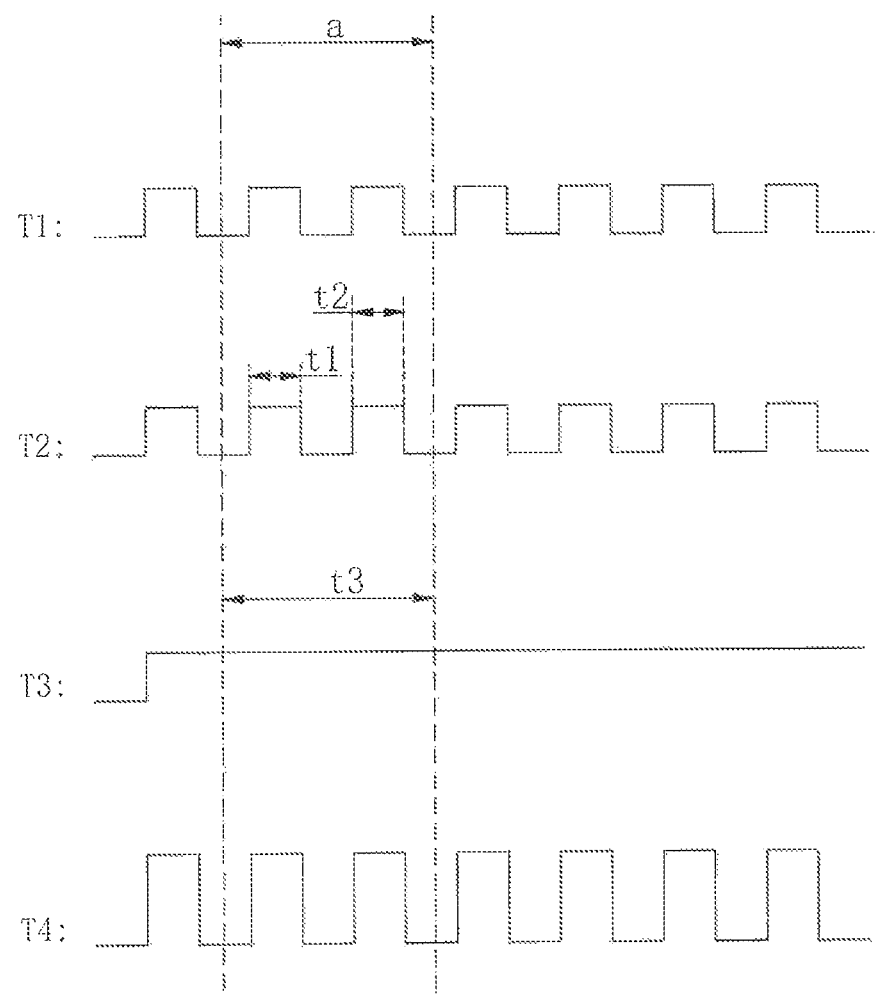
FIG. 4 and FIG. 5 illustrate waveform diagrams of an electric signal detected by a detection circuit according to some implementations of the disclosure.
Figure 5:
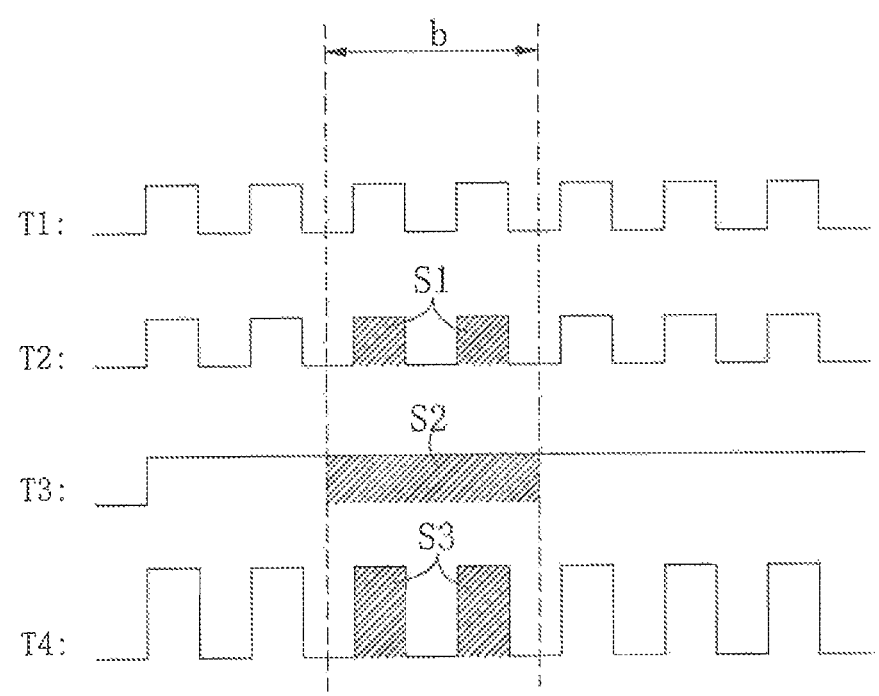

As illustrated in FIG. 2, in the embodiments of the disclosure, the infrared laser emitted by the laser light source 111 is a laser pulse (shown as a signal T1 in FIG. 4 and FIG. 5), namely the laser light source 111 emits the laser pulse when the signal T1 shown in FIG. 4 and FIG. 5 is at a high level, and the laser light source 111 does not emit the laser pulse when the signal T1 is at a low level to avoid a user being hurt by the laser continuously emitted to the outside. In addition, an intensity of the laser emitted by the laser light source 111 is not allowed to exceed a predetermined safety threshold value.

The light receiver 12 includes a lens 121 and a sensor 122. The infrared laser emitted by the light emitter 111 arrives at the target object, and under a reflection action of the target object, the infrared light returns to the light receiver 12 and is received by the light receiver 12. Specifically, reflected infrared light is transmitted through the lens 121 and then is received by the sensor 122. A time difference between emission of the infrared laser by the laser light source 111 and reception of the reflected infrared laser by the sensor 122 may be calculated to calculate a depth (i.e., distance) of the target object relative to the TOF module 10.

As illustrated in FIG. 1 and FIG. 2, the control system 20 may be connected with the TOF module 10. Specifically, the control system 20 is electrically connected with the TOF module 10, and the control system 20 may be configured to control the TOF module 10 to emit and receive the infrared laser. The control system 20 includes photo detector(s) 21 and a detection circuit 22.

The photo detector(s) 21 may specifically be a Photo-Diode (PD). The photo detector(s) 21, after receiving the optical signal (the light), may convert the optical signal into an electric signal. The stronger the strength of the optical signal is, the stronger the strength of the electric signal is; or, in other words, the strength of the electric signal may reflect the strength of the optical signal and a time length of the electric signal may reflect a time length of the optical signal. It may be understood that a source of the light received by the photo detector(s) 21 may be the infrared laser emitted by the laser light source 111 and the source may also be light existing in the external environment. The light existing in the external environment may be visible light or invisible light such as infrared light. Under a normal circumstance, strength of the infrared laser emitted by the laser light source 111 is higher than strength of the light in the external environment, the light in the external environment may be considered as interference stray light, and correspondingly, strength of an electric signal converted from the infrared laser emitted by the laser light source 111 is higher than strength of an electric signal converted from the light in the external environment.

As illustrated in FIG. 2, the detection circuit 22 may be connected with the photo detector(s) 21 to receive the electric signal generated by the photo detector(s) 21, and the electric signal may be subjected to processing such as amplification or de-noising and then received by the detection circuit 22. The detection circuit 22 may be encapsulated into a detection chip or integrated in another function module of the terminal device 1000. The detection circuit 22 may be arranged on the substrate 13 and electrically connected with the substrate 13. In another example, the detection circuit 22 may also be arranged at a position such as a main board of the terminal device 1000. The detection circuit 22 may receive the electric signal converted by the photo detector(s) 21, and the detection circuit 22 may determine whether the TOF module 10 works normally through a feature of the electric signal and, responsive to detecting that the TOF module 10 does not work normally (namely the TOF assembly 100 does not work normally), send a turning-off control signal to turn off the laser light source 111.

Specifically, in combination with FIG. 4, in an example, when the electric signal indicates that a time length, in which the laser light source 111 is in an effective working state within a first duration a, is greater than a preset time length threshold value, the detection circuit 22 determines that the TOF module 10 does not work normally and sends the turning-off control signal to turn off the laser light source 111. The first duration and the time length threshold value may be any time lengths set by the terminal device 1000 according to user information or an environmental factor and may also be personalized settings made by the user according to a safety requirement. For example, the first duration may be 10 milliseconds and the time length threshold value is 8 milliseconds, or the first duration may be 100 nanoseconds and the time length threshold value is 56 nanoseconds, etc. The detection circuit 22 may detect the electric signal within the first duration a, and responsive to detecting that the laser light source 111 is in the effective working state (namely emits the light) within the first duration a for a time length exceeding the time length threshold value, the detection circuit 22 may determine that, within the first duration a, the time length, in which the laser light source 111 emits the light, is excessively long, and the infrared laser may emit excessive energy to the user that may hurt the user, particularly do harm to eyes of the user.

In combination with FIG. 5, in another example, when the electric signal indicates that energy of light emitted from the laser light source 111 within a second duration b is greater than a preset energy threshold value, the detection circuit 22 determines that the TOF module 10 does not work normally and sends the turning-off control signal to turn off the laser light source 111. The second duration and the energy threshold value may be any values set by the terminal device 1000 according to the user information or the environmental factor, and may also be personalized settings made by the user according to the safety requirement. The detection circuit 22 may detect the electric signal within the second duration b, and responsive to detecting that the energy of the light emitted from the laser light source 111 within the second duration b exceeds the energy threshold value, may determine that, within the second duration b, the infrared laser may emit excessive energy to the user to hurt the user and particularly do harm to the eyes of the user.

Figure 6:
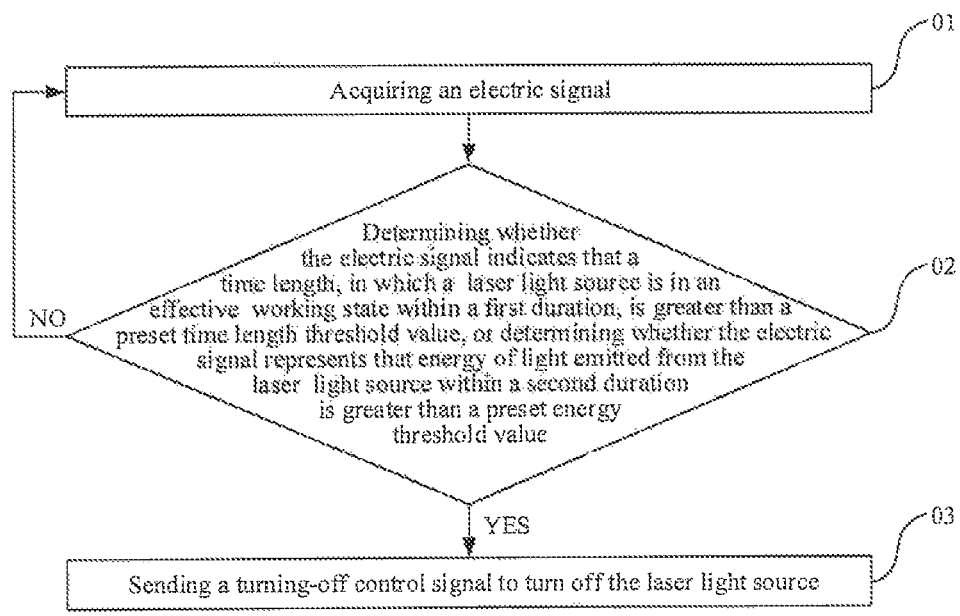
FIG. 6 is a flowchart of a control method for a TOF assembly according to an implementation of the disclosure.

As illustrated in FIG. 6, the disclosure also provides a control method for the TOF assembly 100. The control method for the TOF assembly 100 may be applied to control of the TOF assembly 100. The control method includes the following operations 01 to 03.

In operation 01, an electric signal is acquired.

In operation 02, it is determined whether the electric signal indicates that the time length, in which the laser light source 111 is in the effective working state within the first duration, is greater than the preset time length threshold value, or it is determined whether the electric signal indicates that the energy of the light emitted from the laser light source 111 within the second duration is greater than the preset energy threshold value.

In operation 03, in response to the electric signal indicating that the time length is greater than the preset time length threshold value or the electric signal indicating that the energy is greater than the preset energy threshold value, the turning-off control signal is sent to turn off the laser light source.

It may be understood that, in operation 02, if it is determined that the time length, in which the laser light source 111 is in the effective working state within the first duration, is not greater than the time length threshold value and the energy of the light emitted from the laser light source 111 within the second duration is not greater than the energy threshold value, operation 01 may be continued to be implemented and the laser light source 111 may be kept in a working state.

It may be understood that both the first duration and the second duration may be factory settings of a terminal device 1000 and may also be set by a user and the user may regulate specific numerical values of the first duration and the second duration.

From the above, in the terminal device 1000 and control method for the TOF assembly 100 according to the implementations of the disclosure, the detection circuit 22 detects the electric signal converted by the photo detector(s) 21 and, when the electric signal indicates that the time length, in which the laser light source 111 is in the effective working state within the first duration, is greater than the preset time length threshold value or the electric signal indicates that the energy of the light emitted from the laser light source 111 within the second duration is greater than the preset energy threshold value, the laser light source 111 is turned off, thus hurts to the user can be avoided, and safety in use of the TOF module 10 is relatively high. In addition, the control system 20 of the disclosure detects whether the TOF module 10 works abnormally through a hardware solution, namely through the detection circuit 22. Compared with detection through a software solution, such a hardware solution according to the disclosure can avoid detection failures caused by software crash and the like, and has higher reliability.

In combination with FIG. 4 and FIG. 5, in some implementations, when an amplitude of the electric signal is greater than a first preset amplitude threshold value, the electric signal indicates that the laser light source 111 is in the effective working state. Specifically, when the amplitude of the electric signal is less than the first amplitude threshold value, it is indicated that the electric signal may be generated by reception of ambient light by the photo detector(s) 21 or the electric signal is generated by current disturbance in the control system 20, and in such case, the laser light source 111 is not in the effective working state. Therefore, it is possible to avoid the condition that a state of the TOF module 10 is misjudged to mistakenly turn off the laser light source 111 to affect normal use of the terminal device 1000 by the user. The effective working state may be understood as that the laser light source 111 is emitting the light, and an ineffective working state may be understood as that the laser light source 111 does not emit any light. The first amplitude threshold value may be regulated according to an amount of stray light in the environment and may also be regulated according to a factor such as stability of a system current of the control system 20.

Of course, a feature, indicating that the laser light source 111 is in the effective working state, of the electric signal may also be another feature and is not limited to the above example. For example, when the amplitude of the electric signal is less than a second preset amplitude threshold value, the electric signal indicates that the laser light source 111 is in the effective working state. Specifically, a related operation such as a reverse operation may further be executed on an initial electric signal generated by the photo detector(s) 21 to form a final electric signal, the detection circuit 22 receives the final electric signal, and a feature, indicating that the laser light source 111 is in the effective working state, in the final electric signal is that the amplitude is less than the second preset amplitude threshold value. The second amplitude threshold value may be set according to a related operation rule for the initial electric signal in the control system.

As illustrated in FIG. 4, in some implementations, in response to the electric signal indicating that a continuous time length, in which the laser light source 111 is in the effective working state within the first duration, is greater than the preset time length threshold value, the detection circuit 22 is configured to send the turning-off control signal to turn off the laser light source 111. Specifically, as shown in FIG. 4, an electric signal T2 within the first duration a indicates that time lengths when the laser light source 111 is in the effective working state are t1 and t2 respectively, and in such case, comparison is performed to determine whether t1 is greater than the time length threshold value, comparison is performed to determine whether t2 is greater than the time length threshold value, and when at least one of t1 and t2 is greater than the time length threshold value, the detection circuit 22 sends the turning-off control signal. An electric signal T3 within the time length a indicates that the continuous time length in which the laser light source 111 is in the effective working state is t3, and in such case, comparison is performed to determine whether t3 is greater than the time length threshold value, and when t3 is greater than the time length threshold value, the detection circuit 22 sends the turning-off control signal.

As illustrated in FIG. 4, in some implementations, in response to the electric signal indicating that a total time length, in which the laser light source 111 is in the effective working state within the first duration, is greater than the preset time length threshold value, the detection circuit 22 is configured to send the turning-off control signal to turn off the laser light source 111. Specifically, as shown in FIG. 4, the electric signal T2 within the first duration a indicates that the total time length in which the laser light source 111 is in the effective working state is t1+t2, and in such case, comparison is performed to determine whether t1+t2 is greater than the time length threshold value, and when t1+t2 is greater than the time length threshold value, the detection circuit 22 sends the turning-off control signal. The electric signal T3 within the time length a indicates that the total time length in which the laser light source 111 is in the effective working state is t3, and in such case, comparison is performed to determine whether t3 is greater than the time length threshold value, and when t3 is greater than the time length threshold value, the detection circuit 22 sends the turning-off control signal.

As illustrated in FIG. 5, in some implementations, when an integral of the amplitude of the electric signal within the second duration is greater than a preset integral threshold value, the electric signal indicates that the energy of the light emitted from the laser light source 111 is greater than the preset energy threshold value. Specifically, the integral of the amplitude of the electric signal within the second duration may be represented by an area. As shown in FIG. 5, an integral of an amplitude of the electric signal T2 within the second duration b within the second duration b may be represented by an area S1 of the shadow part, and in such case, comparison is performed to determine whether S1 is greater than the integral threshold value, and when S1 is greater than the integral threshold value, the detection circuit 22 sends the turning-off control signal. An integral of an amplitude of the electric signal T2 within the second duration b within the second duration b may be represented by an area S2 of the shadow part, and in such case, comparison is performed to determine whether S2 is greater than the integral threshold value, and when S2 is greater than the integral threshold value, the detection circuit 22 sends the turning-off control signal. An integral of an amplitude of an electric signal T2 within the second duration b within the second duration b may be represented by an area S3 of the shadow part, and in such case, comparison is performed to determine whether S3 is greater than the integral threshold value, and when S3 is greater than the integral threshold value, the detection circuit 22 sends the turning-off control signal. It may be understood that the condition that the integral is greater than the integral threshold value may occur because an overall amplitude within the second duration b is relatively high, or the time length in which the laser light source 111 emits the light is relatively long or both the amplitude and the time length in which the laser light source 111 emits the light are relatively great. Particularly, when the second duration b is set to be short enough, for example, infinitely close to 0, an integral value of the amplitude of the electric signal within the second duration b is the amplitude, and in such case, comparison is performed to obtain a magnitude relationship between the amplitude and the integral threshold value, and when the amplitude is greater than the integral threshold value, the electric signal indicates that the energy of the light emitted from the laser light source 111 is greater than the energy threshold value.

In some implementations, the time length threshold value is set according to a distance between the TOF assembly 100 and the target object. The distance between the TOF assembly 100 and the target object may be represented by a distance between the TOF module 10 and the object. It may be understood that, the shorter the distance between the TOF module 10 and the target object (for example, a person) is, the less the loss of the infrared laser propagated between the TOF module 10 and the target object is, and the stronger the energy of the infrared laser received by the target object is. Therefore, it is necessary to set different time length threshold values for different distances to ensure relatively high safety in use of the TOF module 10 by the user at different distances. Specifically, the shorter the distance is, the smaller the time length threshold value may be set to be; and the longer the distance is, the larger the time length threshold value may be set to be. Similarly, the energy threshold value may also be set according to the distance between the TOF module 10 and the target object. Specifically, the shorter the distance is, the smaller the energy threshold value may be set to be; and the longer the distance is, the larger the energy threshold value may be set to be.

In combination with FIG. 1, the distance between the TOF module 10 and the target object may be detected by a distance detector 400. Specifically, the distance detector 400 may be a Proximity Sensor (PS). The distance detector 400 may further include at least two imaging devices and acquires the distance between the TOF module 10 and the target object by use of a principle of binocular range finding. The distance detector 400 may also be a single imaging device and calculates the distance between the TOF module 10 and the target object according to a proportion of the target object in an image formed by the single imaging device. Of course, the distance detector 400 may also be of another specific form and is not limited to the above examples. For example, the distance detector 400 may be the TOF module 10 and detects the distance between the TOF module 10 and the target object through the TOF module 10.

In some implementations, the time length threshold value is set according to an intensity of ambient light. As described above, the light in the external environment may affect the strength of the electric signal, and within part of the time length, the electric signal may represent that the laser light source 111 is in the effective working state because of influence of the light in the external environment. For reducing an influence degree of the light in the external environment for a determination result, the time length threshold value may be set according to the light intensity in the external environment. Specifically, the stronger the intensity of the ambient light is, the larger the time length threshold value is set to be; and the lower the intensity of the ambient light is, the smaller the time length threshold value is set to be. Similarly, the energy threshold value may also be set according to the intensity of the ambient light. Specifically, the stronger the intensity of the ambient light is, the larger the energy threshold value is set to be; and if the lower the intensity of the ambient light is, the smaller the energy threshold value is set to be.

In combination with FIG. 1, the intensity of the ambient light may be detected by a light detector 500. Specifically, the light detector 500 may be a light sensor, and the light sensor is configured to detect the light intensity in the environment. The light detector 500 may also be an imaging device, and after the imaging device shoots an image of a present scenario, a light intensity of an environment of the present scenario is calculated according to a brightness value of a pixel of the image.

Figure 7:
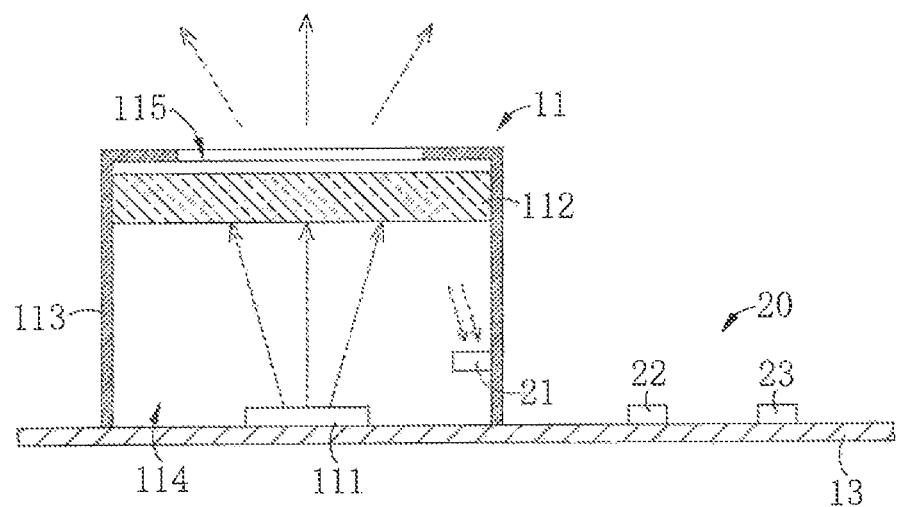
FIG. 7 to FIG. 10 illustrate partial diagrams of a TOF module and a control system according to some implementations of the disclosure.

As illustrated in FIG. 2 and FIG. 7, in some implementations, the photo detector(s) 21 is received in the receiving cavity 114. Under a covering action of the emission housing 113, the photo detector(s) 21 received in the receiving cavity 114 receives less external stray light. Specifically, as shown in FIG. 2, the photo detector(s) 21 may be arranged on the substrate 13 such that the photo detector(s) 21 is electrically connected with the substrate 13. As shown in FIG. 7, the photo detector(s) 21 may also be arranged on an inner wall of the emission housing 113, and the photo detector(s) 21 is relatively close to the optical element 112 and may easily receive the infrared laser reflected by the optical element 112.

Figure 8:
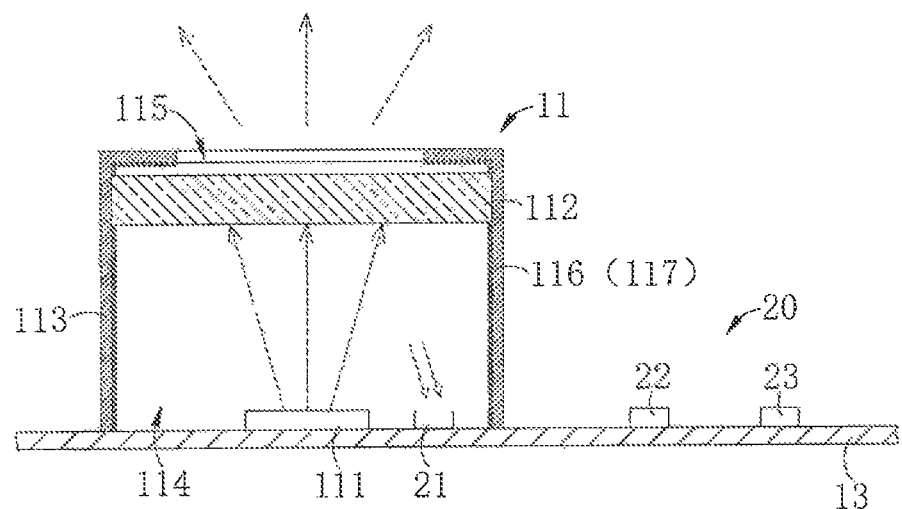

As illustrated in FIG. 8, in some implementations, a light absorption layer 116 is arranged on the inner wall of the emission housing 113. After the light arrives at the light absorption layer 116, most of the light is absorbed by the light absorption layer 116 and not reflected, so that the light reflected by the inner wall of the emission housing 113 is reduced, the light received by the photo detector(s) 21 is substantially light directly reflected by the photo detector(s) 21, and thus interference of the stray light is reduced.

Still As illustrated in FIG. 8, in some implementations, a light reflection layer 117 is arranged on the inner wall of the emission housing 113. After the light arrives at the light reflection layer 117, most of the light is reflected by the light reflection layer 117, so that an amount of light finally arriving at the photo detector(s) 21 is increased, a requirement on detection sensitivity of the photo detector(s) 21 is further reduced, and cost of the photo detector(s) 21 is reduced.

Specifically, either the light absorption layer 116 or the light reflection layer 117 may be used. The light absorption layer 116 and the light reflection layer 117 may be films adhered to the inner wall of the emission housing 113, may also be coatings with which the inner wall of the emission housing 113 is coated and may further be part of an inner wall formed by treating the inner wall of the emission housing 113 through a special process.

Figure 9:
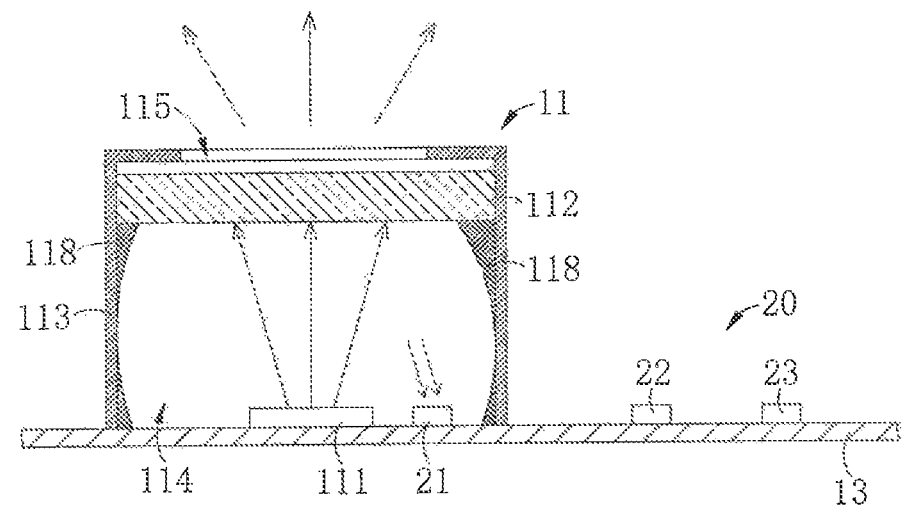

As illustrated in FIG. 9, in some implementations, a light condensing mechanism 118 is arranged in the receiving cavity 114, and the light condensing mechanism 118 is configured to condense light incident on the light condensing mechanism 118 to the photo detector(s) 21. The light condensing mechanism 118 condenses the light to the photo detector(s) 21, so that the photo detector(s) 21 may receive a relatively large amount of light, the requirement on the detection sensitivity of the photo detector(s) 21 is reduced, and the cost of the photo detector(s) 21 is reduced. Specifically, the light condensing mechanism 118 may be a mechanism with a concave reflecting surface, and light arriving at the concave reflecting surface is reflected to the photo detector(s) 21.

Figure 10:
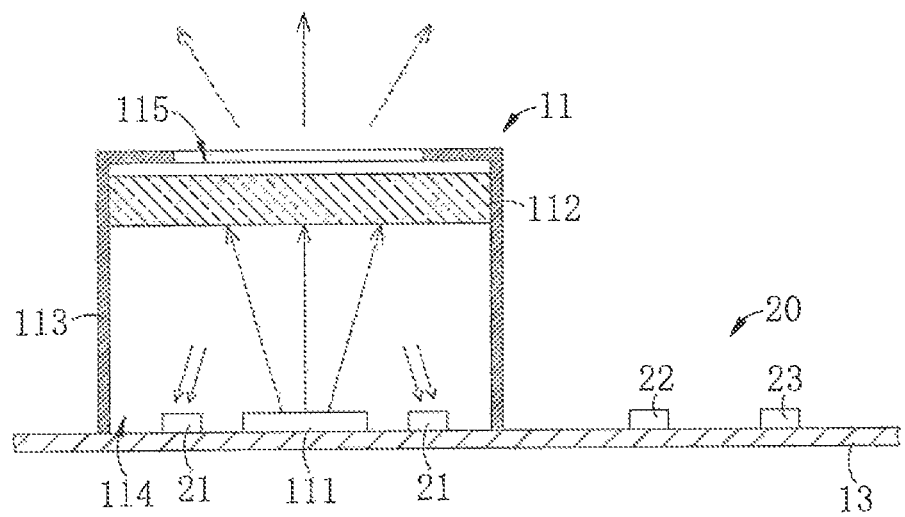
Figure 11:
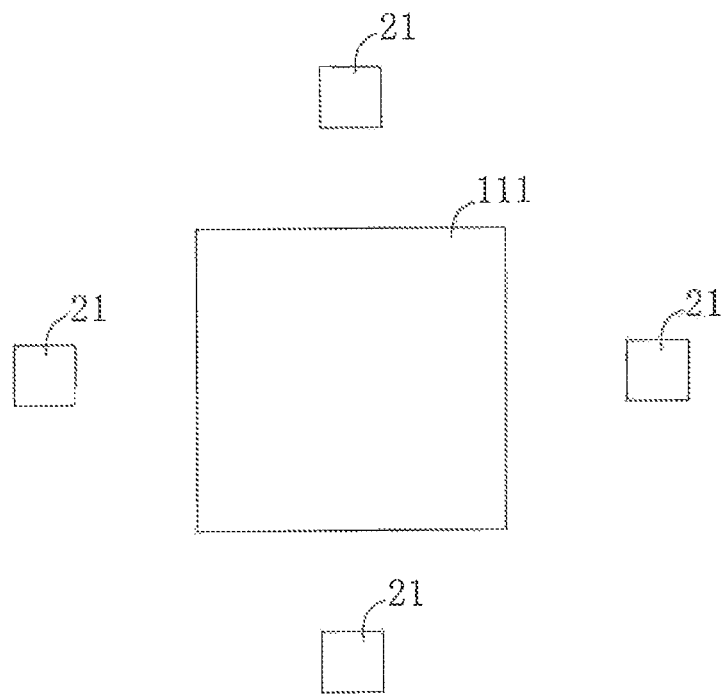
FIG. 11 illustrates a diagram of a laser light source and photo detector(s) of a TOF assembly according to an implementation of the disclosure.

As illustrated in FIG. 10 and FIG. 11, in some implementations, there are multiple photo detectors 21, for example, two, three, four, five, six or ten photo detectors. The multiple photo detectors 21 may be arranged around the laser light source 111 to detect the infrared laser emitted to multiple directions by the laser light source 111. For example, positions where at least two photo detectors 21 are arranged are symmetric about the laser light source 111.

In an example, one of the multiple photo detectors 21 is in a working state. That is, at the same time, one photo detector 21 is in the working state and the other photo detectors 21 may not be in the working state, so that electric energy for driving the photo detectors 21 to work is saved. For example, the multiple photo detectors 21 may work in a time division manner, namely alternately receiving and converting light into electric signals, to reduce workloads of the photo detectors 21.

Figure 12:
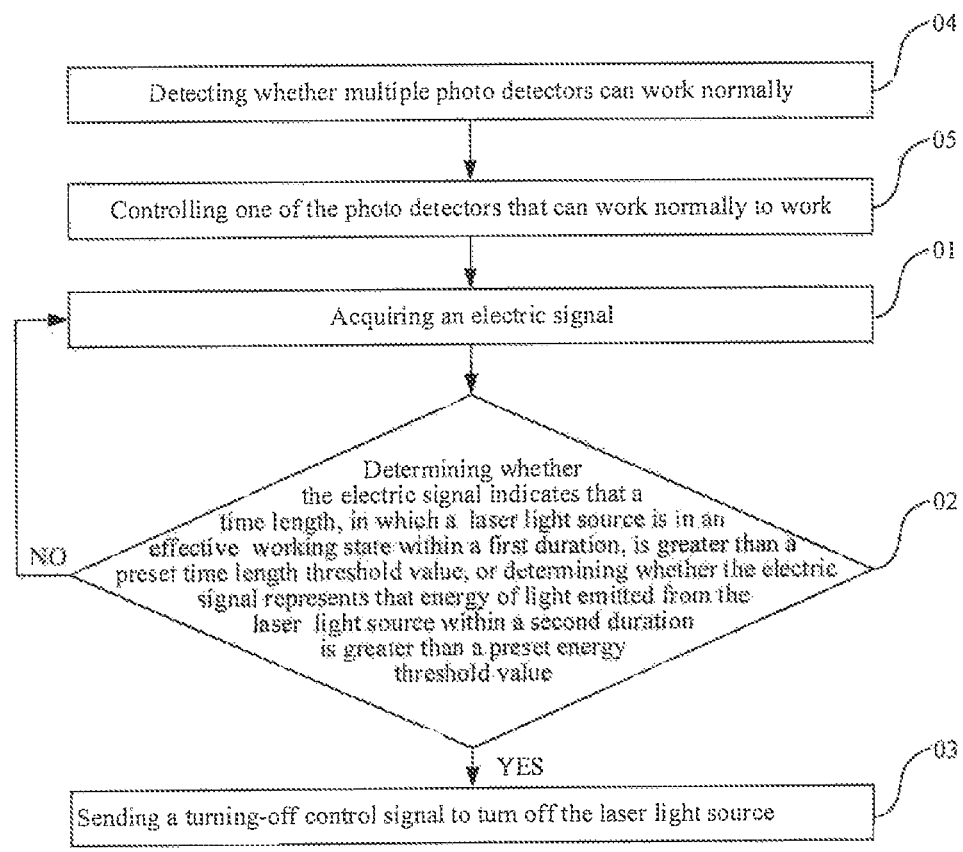
FIG. 12 is a flowchart of a control method for a TOF assembly according to an implementation of the disclosure.

In combination with FIG. 12, in some implementations, the control method for the TOF assembly 100 further includes the following operations 04 and 05.

In operation 04, it is detected whether the multiple photo detectors 21 can work normally.

In operation OS, one of the photo detectors 21 that can work normally is controlled to work.

By controlling one of the photo detectors 21 that may work normally to work, the electric energy for driving the photo detectors 21 to work may be saved on one hand; and on the other hand, when the presently used photo detector 21 is damaged, another photo detector 21 that may work normally may be controlled to work, so that the control system 20 may run normally.

In another example, at least two of the multiple photo detectors 21 are in the working state. In such case, the at least two photo detectors 21 simultaneously generate electric signals, and the detection circuit 22 may acquire the electric signals generated by the at least two photo detectors 21 respectively and determine whether the TOF module 10 works normally according to the at least two electric signals respectively. Specifically, during determination respectively through the at least two electric signals, when it is determined through all the electric signals that the TOF module 10 does not work normally, the detection circuit 22 sends the turning-off control signal to turn off the laser light source 111 to avoid the condition that some failing photo detectors 21 give false alarms and finally the laser light source 111 is mistakenly turned off. Specifically, during determination respectively through the at least two electric signals, when it is determined through one electric signal that the TOF module 10 does not work normally, the detection circuit 22 sends the turning-off control signal to turn off the laser light source 111 to avoid the condition that some failing photo detectors 21 may not generate the electric signals normally and thus may not detect an abnormal working state of the TOF module 10.

Figure 13:
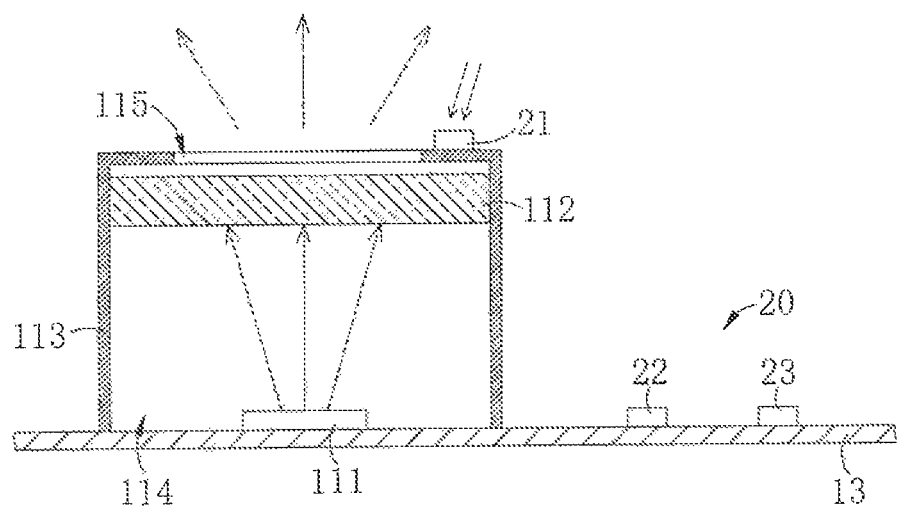
FIG. 13 and FIG. 14 illustrate partial diagrams of a TOF module and a control system according to some implementations of the disclosure.

As illustrated in FIG. 13, in some implementations, the photo detector 21 is arranged outside the receiving cavity 114. Specifically, the photo detector 21 may be arranged at an edge of the light outlet 115 and partially overlaps the light outlet 115, and the photo detector 21 mainly receives the infrared laser emergent from the light outlet 115 and the light in the external environment to generate the electric signal. A position where the photo detector 21 is arranged may also not overlap a position of the light outlet 115, and the photo detector 21 mainly receives the light in the external environment to generate the electric signal. In such a manner, when the photo detector 21 is required to be maintained or replaced, the emission housing 113 is not required to be disassembled, and the photo detector 21 may be conveniently maintained.

Figure 14:
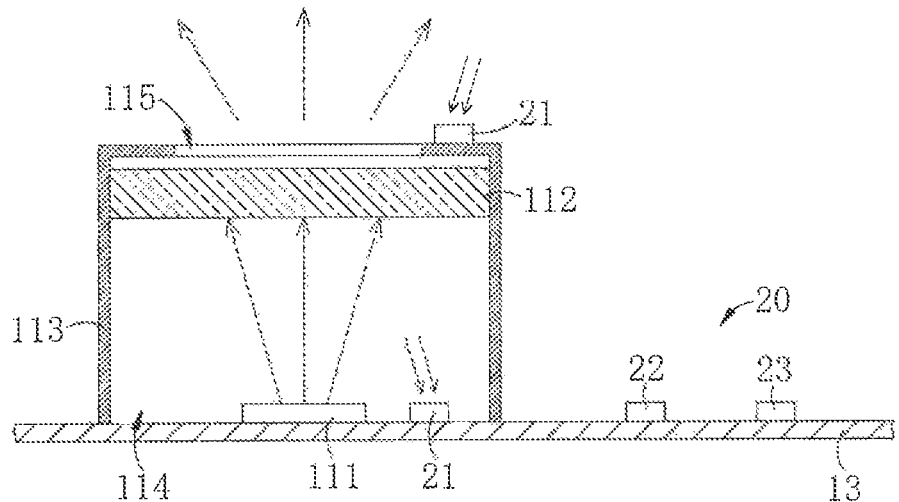

As illustrated in FIG. 14, in some implementations, there are multiple photo detectors 21, where at least one photo detector 21 is arranged in the receiving cavity 114, and at least one another photo detector 21 is arranged outside the receiving cavity 114.

Figure 15:
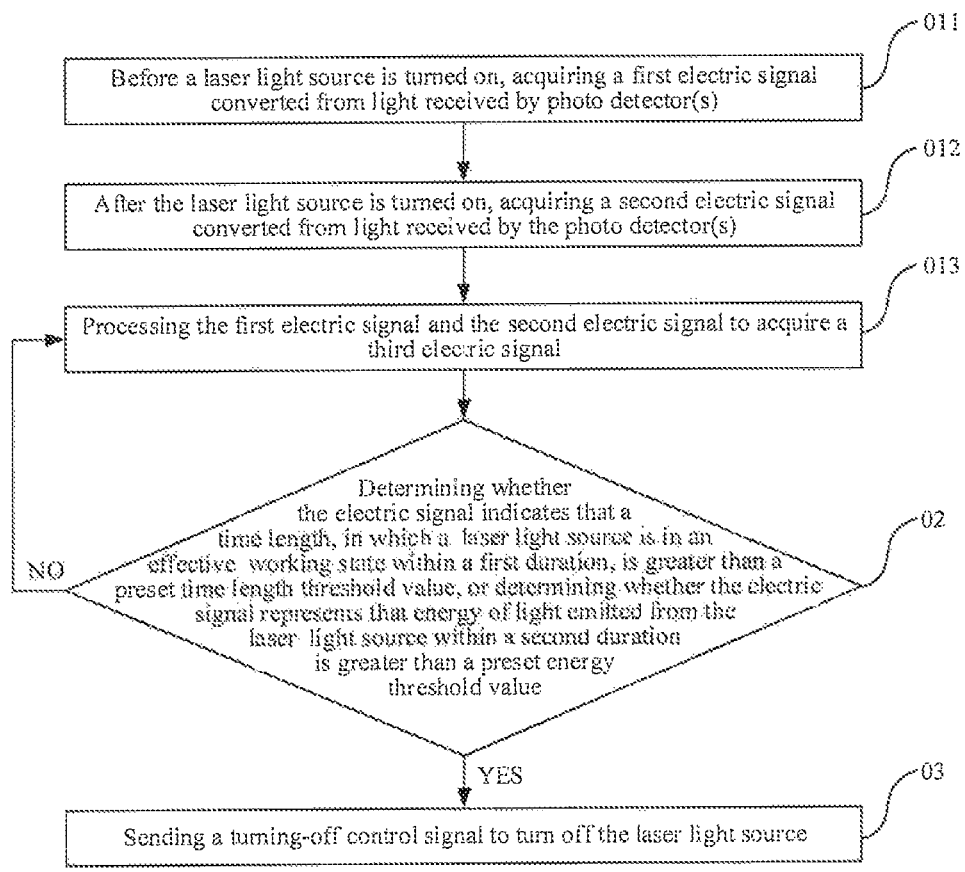
FIG. 15 is a flowchart of a control method for a TOF assembly according to an implementation of the disclosure.

As illustrated in FIG. 15, in some implementations, the operation 01 that the electric signal is acquired includes the following sub-operations.

In 011, before the laser light source 111 is turned on, a first electric signal converted from the light received by the photo detector(s) 21 is acquired.

In 012, after the laser light source 111 is turned on, a second electric signal converted from the light received by the photo detector(s) 21 is acquired.

In 013, the first electric signal and the second electric signal are processed to acquire a third electric signal.

Operations 011, 012 and 013 may be applied to the arrangement for the photo detector(s) 21 as shown in FIG. 14. As described above, the photo detector(s) 21 arranged in the receiving cavity 114 mainly receives the infrared laser reflected by the optical element 112 or the inner wall of the emission housing 113 and the light in the external environment to generate the electric signal (i.e., the second electric signal), and the photo detector(s) 21 arranged outside the receiving cavity 114 mainly receives the light in the external environment to generate the electric signal (i.e., the first electric signal). When the first electric signal and the second electric signal are processed, an amplitude of the first electric signal may be subtracted from an amplitude of the second electric signal to obtain the third electric signal. The third electric signal may be configured to represent a magnitude of the electric signal generated from the infrared laser reflected by the optical element 112 or the inner wall of the emission housing 113. Whether the TOF module 10 works normally is subsequently determined by use of the third electric signal, so that the interference of the light in the external environment is reduced, and relatively high determination accuracy is ensured.

Operations 011, 012 and 013 may also be applied to the manner that the photo detector(s) 21 is arranged in the receiving cavity 114 (as shown in FIG. 1, FIG. 7, FIG. 8, FIG. 9 and FIG. 10). Before the laser light source 111 is turned on, the first electric signal is acquired, and in such case, the first electric signal is only generated from the received light in the external environment; and after the laser light source 111 is turned on, the second electric signal is acquired, and in such case, the second electric signal is generated from the received light in the external environment and the infrared laser reflected by the optical element 112 or the inner wall of the emission housing 113. After the first electric signal and the second electric signal are processed, the third electric signal is obtained. For example, the amplitude of the first electric signal may be subtracted from the amplitude of the second electric signal, the influence of the light in the external environment is reduced by the third electric signal, and when whether the TOF module 10 works normally is determined by use of the third electric signal, relatively high determination accuracy is ensured.

Figure 16:
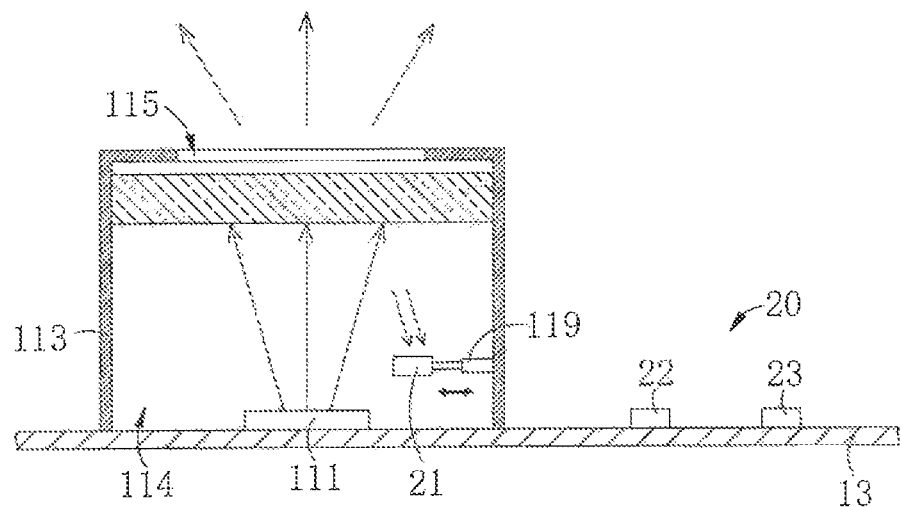
FIG. 16 and FIG. 17 illustrate partial diagrams of a TOF module and a control system according to some implementations of the disclosure.
Figure 17:
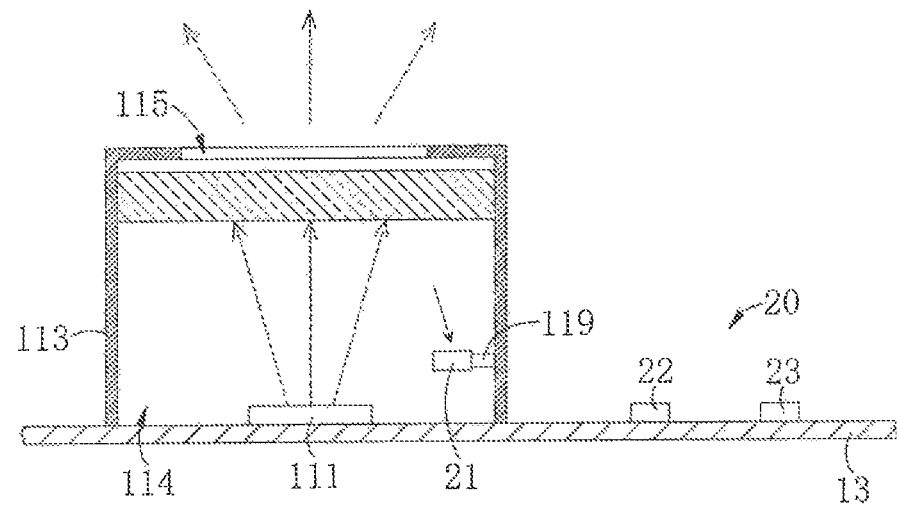

As illustrated in FIG. 16 and FIG. 17, in some implementations, the TOF assembly 100 further includes a driving mechanism 119, the driving mechanism 119 is connected with the photo detector(s) 21, and the driving mechanism 119 may drive the photo detector(s) 21 to move. Specifically, the driving mechanism 119 may drive the photo detector(s) 21 to move, rotate or revolve about a preset rotating shaft, and the driving mechanism 119 may be a Micro-Electro-Mechanical System (MEMS). In examples shown in FIG. 16 and FIG. 17, the driving mechanism 119 may drive the photo detector(s) 21 to move to be close to the light outlet 115 (as shown in FIG. 16) or far away from the light outlet 115 (as shown in FIG. 17).

Figures 18, 19:
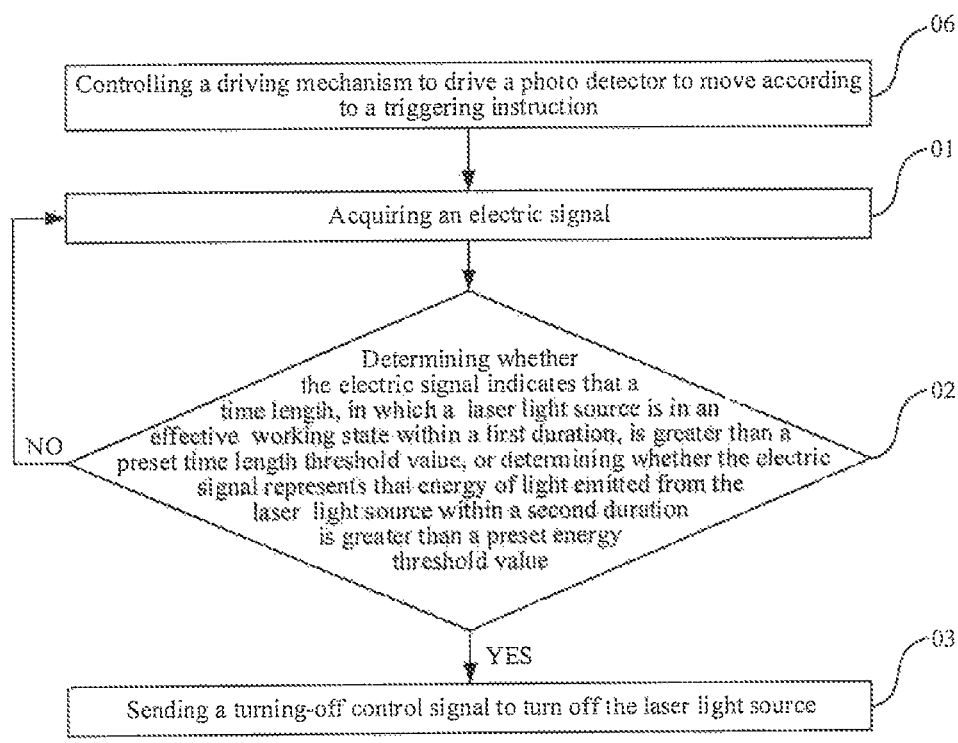
FIG. 18 is a flowchart of a control method for a TOF assembly according to an implementation of the disclosure.
FIG. 19 and FIG. 20 illustrate partial diagrams of a TOF module and a control system according to some implementations of the disclosure.

In combination with FIG. 18, in some implementations, the control method for the TOF assembly 100 further includes operation 06. In operation 06, the driving mechanism 119 is controlled to drive the photo detector(s) 21 to move according to a triggering instruction. The triggering instruction may be transmitted by an AP of the terminal device 1000. Specifically, the triggering instruction is transmitted when a predetermined triggering condition is met.

In an example, the triggering instruction may be transmitted when the intensity of the environmental light is greater than a preset light intensity threshold value. For example, as shown in FIG. 16 and FIG. 17, in a state shown in FIG. 16, the photo detector(s) 21 is relatively close to the light outlet 115, and the external light is transmitted through the light outlet 115, then enters the receiving cavity 114, and is easily received by the photo detector(s) 21. When the intensity of the environmental light is greater than the preset light intensity threshold value, the external light may affect the electric signal greatly, and then the triggering instruction may be transmitted to cause the driving mechanism 119 to drive the photo detector(s) 21 to move to a state shown in FIG. 17. In such case, the photo detector(s) 21 is relatively far away from the light outlet 115 and unlikely to receive the external light, and is affected by the external light less. The intensity of the environmental light may be detected by the light detector 500.

Of course, the triggering condition for transmitting the triggering instruction is not limited to the example and may also be another condition. For example, responsive to detecting that an inclination angle of the terminal device 1000 is a predetermined angle, it is determined that the light outlet 115 may be opposite to the light source, and in such case, the triggering instruction may be transmitted to cause the photo detector(s) 21 to move.

Figure 20:
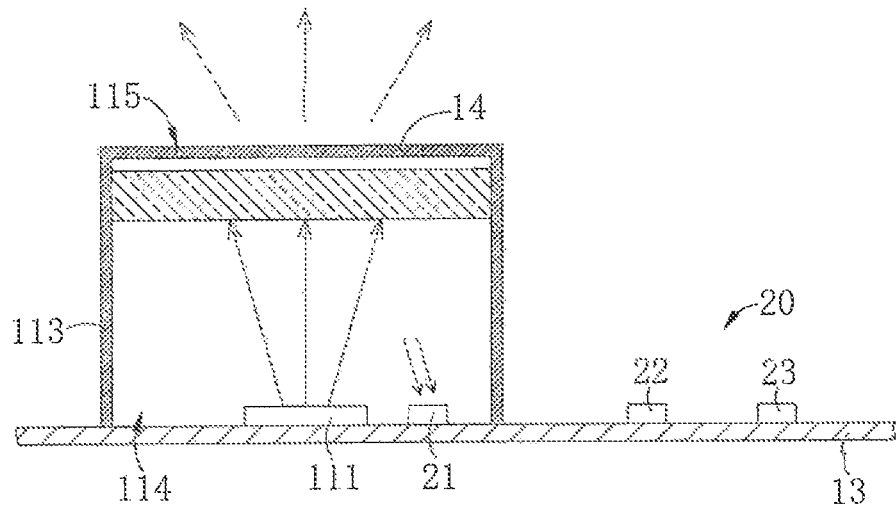

As illustrated in FIG. 19 and FIG. 20, in some implementations, the TOF assembly 100 further includes a light filter member 14, and the light filter member 14 is arranged on a light path of the light received by the photo detector(s) 21. The light filter member 14 may filter part of the light arriving at the photo detector(s) 21 to reduce the influence of the stray light. Specifically, a type of the light that may be filtered by the light filter member 14 may be set according to a requirement of the user. For example, a wavelength interval of the light that may be transmitted through the light filter member 14 is matched with a wavelength of the laser emitted by the laser light source 111. The wavelength interval may be, for example, [900 nanometers, 980 nanometers]. The wavelength of the laser emitted by the laser light source 111 falls within the wavelength interval such that relatively high transmittance is ensured when the laser emitted by the laser light source 111 is transmitted through the light filter member 14 and part of the stray light in the external environment is filtered.

The light filter member 14 may specifically be a light filter membrane, a light filter and the like. As shown in FIG. 19, the light filter member 14 may be arranged on a receiving surface of the photo detector(s) 21, and the light is required to be transmitted through the light filter member 14 to enter the photo detector(s) 21. As shown in FIG. 20, the light filter member 14 may cover the light outlet 115, and in such case, the light filter member 14 may be an infrared transmission light filter member, so that influence on transmission of the infrared laser through the light filter member 14 is avoided, the external stray light may not enter the receiving cavity 114 through the light outlet 115 and may not interfere with the electric signal generated by the photo detector(s) 21.

Figure 21:
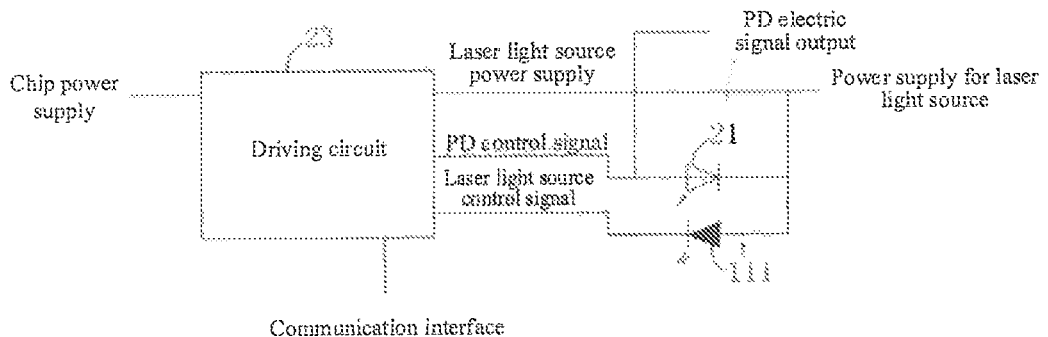
FIG. 21 illustrates a schematic diagram of a structure and signal transmission direction of a driving circuit according to an implementation of the disclosure.
Figure 22:
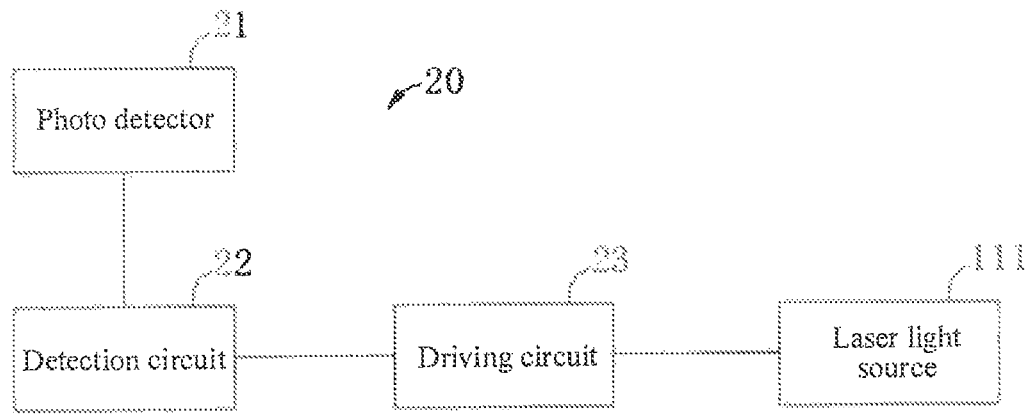
FIG. 22 illustrates a schematic module diagram of a control system according to an implementation of the disclosure.

As illustrated in FIG. 21 and FIG. 22, in some implementations, the control system 20 further includes a driving circuit 23, the driving circuit 23 is connected with the laser light source 111, and the driving circuit 23 is configured to drive the laser light source 111 to emit the laser. The detection circuit 22 is connected with the driving circuit 23, and the driving circuit 23, when receiving the turning-off control signal, turns off the laser light source 111.

Figure 23:
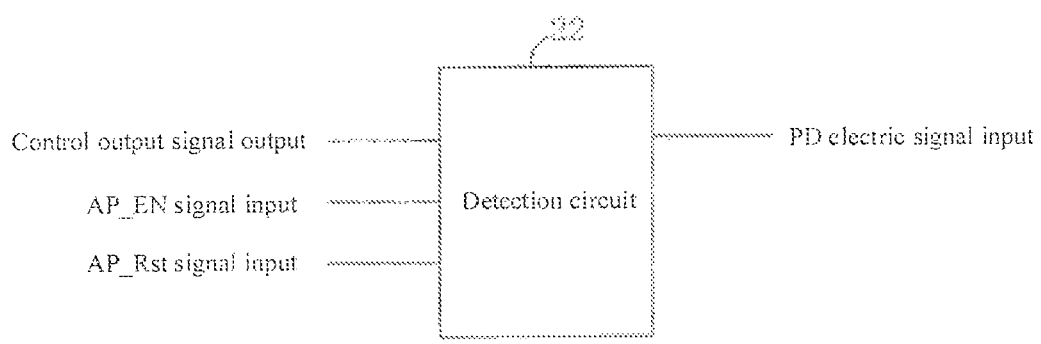
FIG. 23 illustrates a schematic diagram of a structure and signal transmission direction of a detection circuit according to an implementation of the disclosure.

Specifically, as shown in FIG. 21, the driving circuit 23 may be encapsulated into a chip, and the driving circuit 23 may acquire electric energy from an external power supply through a chip power supply pin, communicate with an external module through a communication interface (for example, an SDIO pin and an SCLK pin) and be connected with a power supply for the laser light source through a laser light source power supply pin, be connected with the photo detector(s) 21 through a PD control signal pin and be connected with the laser light source 111 through a control signal pin for the laser light source 111. The driving circuit 23 may be arranged on the substrate 13. As illustrated in FIG. 21 to FIG. 23, the detection circuit 22 is connected with the driving circuit 23, the detection circuit 22 may send a control output signal to the driving circuit 23, the control output signal may be the turning-off control signal, and when the driving circuit 23 receives the turning-off control signal, the driving circuit 23 turns off the laser light source 111 to control the laser light source 111 to stop emitting the laser to the outside.

Figure 24:
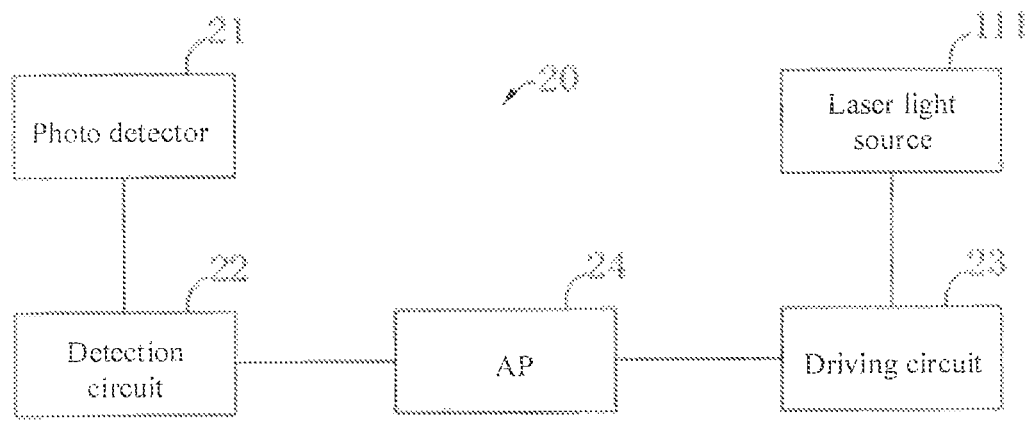
FIG. 24 to FIG. 27 illustrate schematic block diagrams of a control system according to some implementations of the disclosure.

As illustrated in FIG. 24, in some implementations, the control system 20 further includes an AP 24 and the driving circuit 23. The AP 24 is connected with the detection circuit 22. The driving circuit 23 is connected with the AP 24, and the driving circuit 23 is connected with the laser light source 111 and configured to drive the laser light source 111 to emit the laser. When the AP 24 receives the turning-off control signal, the AP 24 controls the driving circuit 23 to turn off the laser light source 111.

In combination with FIG. 23, the AP 24 may serve as a system of the terminal device 1000, the AP 24 is connected with the detection circuit 22, the detection circuit 22 may be controlled by the AP 24 to work, and the AP 24 may send a control signal such as an enabling signal (AP_EN signal) and a resetting signal (AP_Rst signal) to the detection circuit 22. In addition, the detection circuit 22 may send the control output signal to the AP 24, when the control output signal is the turning-off control signal, the AP 24 may send a turning-off control instruction to the driving circuit 23 through the communication interface of the driving circuit 23, and the driving circuit 23 responds to the turning-off control instruction to turn off the laser light source 111 to control the laser light source 111 to stop emitting the laser to the outside.

Figure 25:
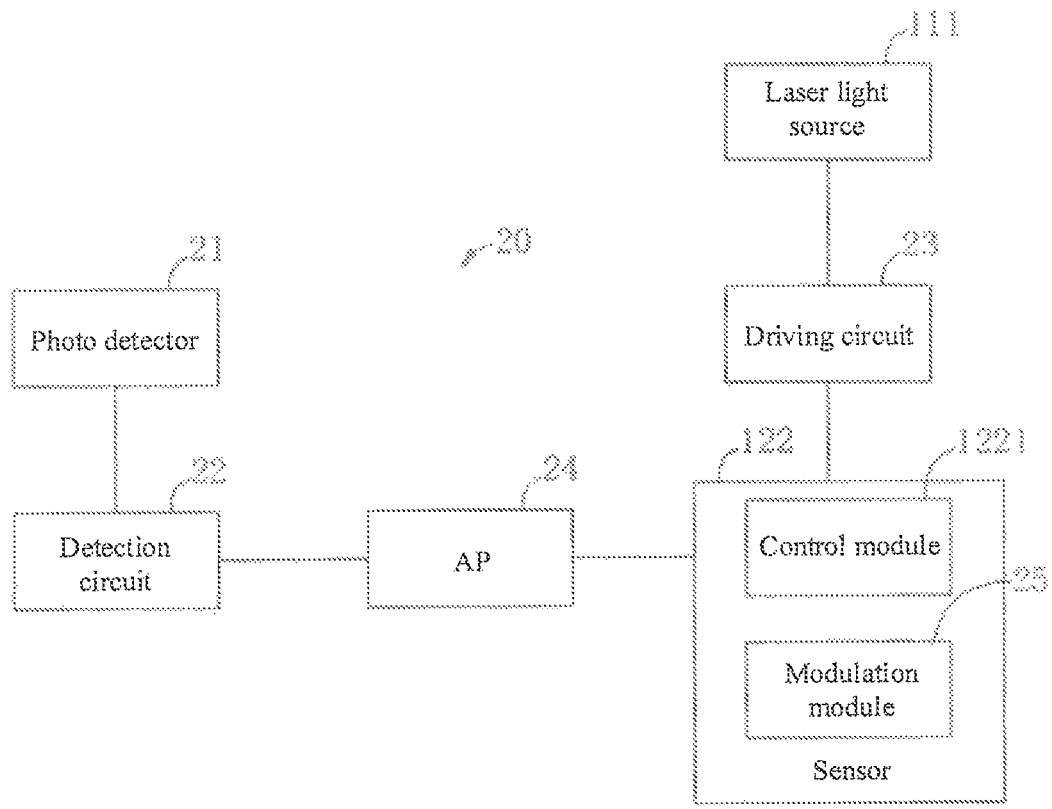

As illustrated in FIG. 25, in some implementations, the sensor 122 includes a control module 1221 embodied as for example a control circuit. The control system 20 further includes the AP 24, the driving circuit 23 and a modulation module 25 embodied as for example a modulation circuit. The AP 24 is connected with the detection circuit 22 and the sensor 122. The modulation module 25 stores preset modulation information. The driving circuit 23 is connected with the modulation module 25 to receive the preset modulation information, and the driving circuit 23 is connected with the laser light source 111 and configured to drive the laser light source 111 to emit the laser light according to the modulation information. When the AP 24 receives the turning-off control signal, the AP 24 sends the turning-off control signal to the control module 1221, and the control module 1221 controls the driving circuit 23 to turn off the laser light source 111 according to the turning-off control signal.

The modulation module 25 may send the stored preset modulation information to the driving circuit 23, the preset modulation information may correspond to a preset modulation manner for the laser light source 111, and when the TOF module 10 works normally, the driving circuit 23 drives the laser light source 111 to emit the laser light according to the modulation manner. The modulation manner may include information such as period information and power information about laser pulse emission of the laser light source 111. The modulation manner may correspond to multiple pieces of modulation information, and in different application scenarios, the driving circuit 23 may drive the laser light source 111 to emit the laser light according to different modulation manners.

When the detection circuit 22 transmits the turning-off control signal, it is indicated that the laser light source 111 may not emit the laser according to the preset modulation manner because the modulation module 25 fails or wrong modulation information is selected. A connecting manner for the detection circuit 22 and the AP 24 may be shown in FIG. 23. The AP 24, when receiving the turning-off control signal transmitted by the detection circuit 22, sends the turning-off control signal to the control module 1221 of the sensor 122.

The control module 1221, after receiving the turning-off control signal, directly controls the driving circuit 23 to turn off the laser light source according to the turning-off control signal and may not control the driving circuit 23 to drive the laser light source 111 according to the modulation manner anymore, to preferably ensure that the light source is turned off.

In an example, the modulation module 25 may be integrated in the sensor 122 to ensure a relatively high integration level of the control system 20 and the TOF module 10 and a relatively small size.

Figure 26:
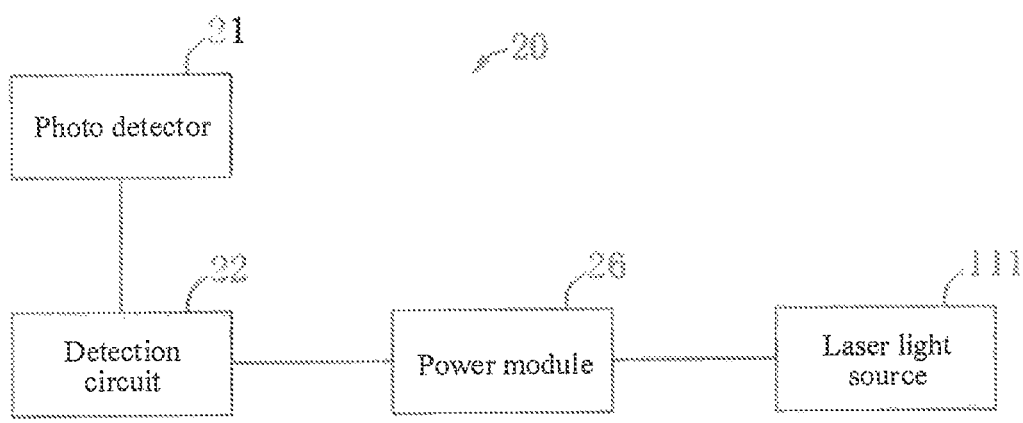

As illustrated in FIG. 26, in some implementations, the control system 20 further includes a power module 26 embodied as for example a power supply circuit, and the power module 26 is connected with the laser light source 111 and configured to supply power to the laser light source 111. The power module 26 is further connected with the detection circuit 22, and the power module 25, when receiving the turning-off control signal, cuts off the power supplied to the laser light source 111.

In combination with FIG. 23, the detection circuit 22 may send the control output signal to the power module 26, and when the control output signal is the turning-off control signal, the power module 26 cuts off the power supplied to the laser light source 111 to achieve the purpose of turning off the laser light source 111. Specifically, when the TOF module 10 works normally, the detection circuit 22 may send a low-level electric signal to the power module 26, the power module 26 keeps supplying the power to the laser light source 111. When the detection circuit 22 sends a high-level electric signal (which may be considered as the turning-off control signal), the power module 26 stops supplying the power to the laser light source 111 responsive to the high-level electric signal. When the detection 22 resends a low-level electric signal to the power module 26, the power module 26 recovers power supply to the laser light source 111.

Figure 27:
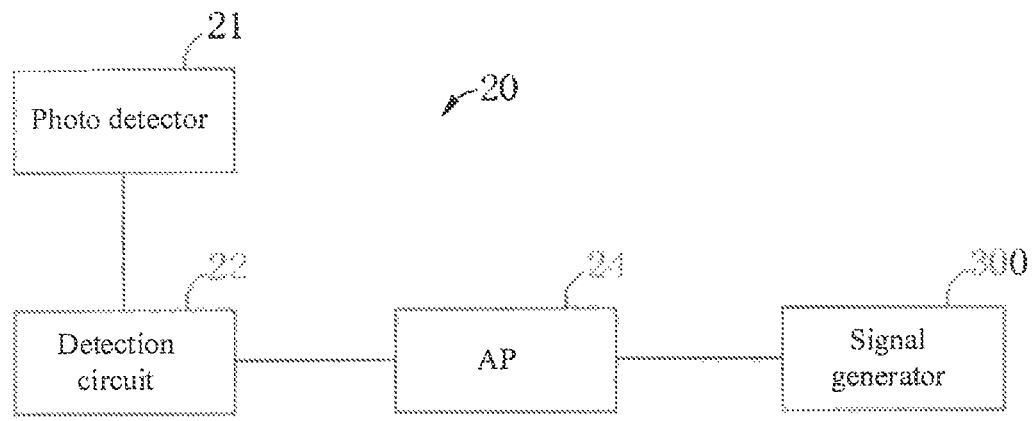

As illustrated in FIG. 1 and FIG. 27, in some implementations, the terminal device 1000 further includes a signal generator 300, and the signal generator 300 is configured to, when the detection circuit 22 sends the turning-off control signal, send prompting information indicating that the TOF assembly 100 is abnormal.

Specifically, the signal generator 300 may be connected with the AP 24 of the terminal device 1000, and the AP 24 may be connected with the detection circuit 22. When the AP 24 receives the turning-off control signal, the AP 24 controls the signal generator 300 to send the prompting information indicating that the TOF assembly 100 is abnormal.

Figure 28:
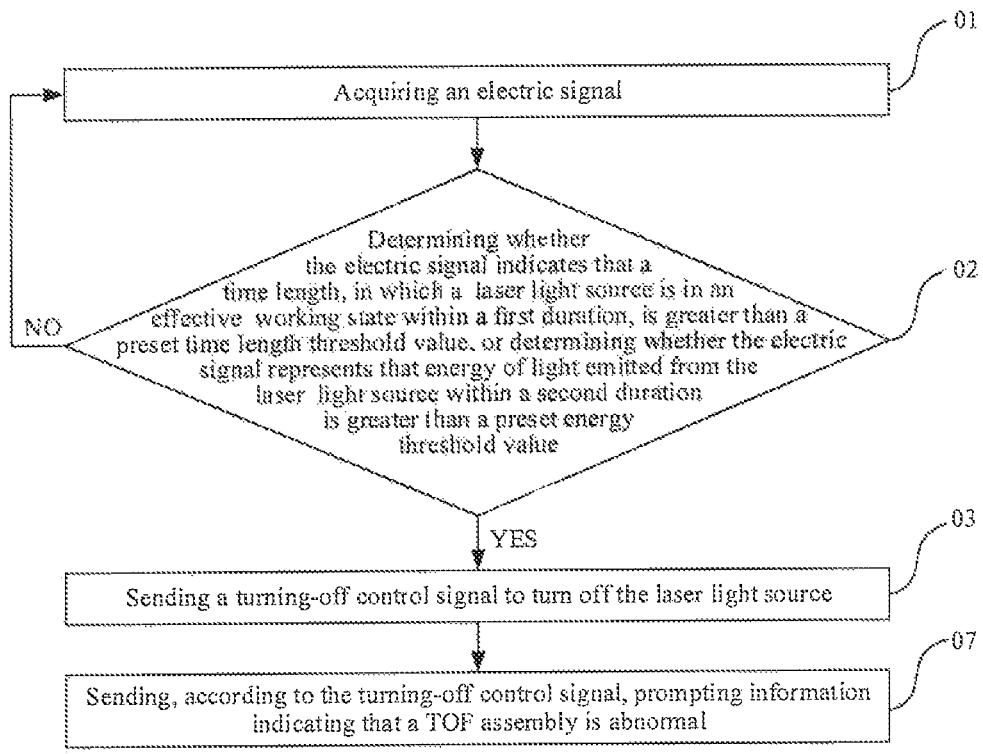
FIG. 28 is a flowchart of a control method for a TOF assembly according to an implementation of the disclosure.

In combination with FIG. 28, in some implementations, the control method for the TOF assembly 100 further includes operation 07. In operation 07, the prompting information indicating that the TOF assembly 100 is abnormal is sent according to the turning-off control signal.

Figure 29:
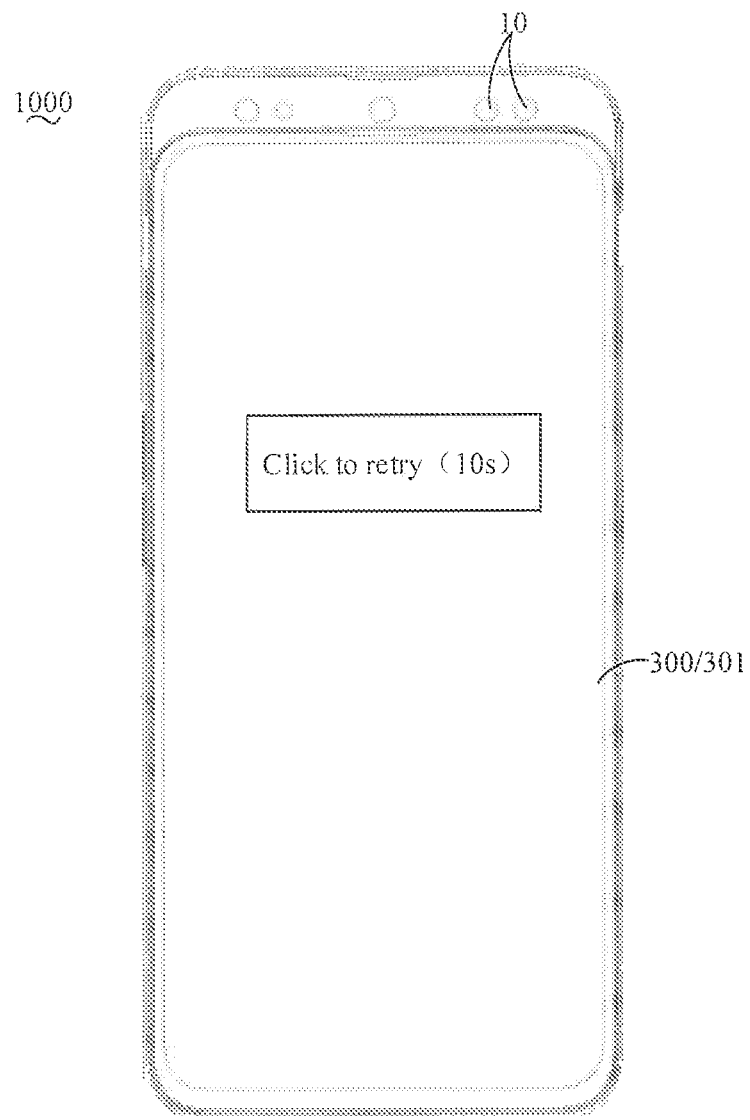
FIG. 29 illustrates a schematic diagram of a scenario where a signal generator sends prompting information according to an implementation of the disclosure.

The user may learn through the prompting information sent by the signal generator 300 that the TOF module 10 does not work normally and may hurt the user, and the user may timely adopt a corresponding measure to avoid hurts, for example, turning off the terminal device 1000 and changing an orientation of the terminal device 1000 to avoid irradiation of the laser. Specifically, the signal generator 300 may be a light generator. In an example, as shown in FIG. 29, the signal generator 300 may be the display screen 301, and the prompting information may be display information displayed on the display screen 301, for example, a prompting text, pattern and animation that is displayed. The signal generator 300 may also be a sound generator, and the prompting information may be a voice prompt. In an example, the signal generator 300 may be a speaker and the like, and the prompting information may be a voice prompt made by the speaker. The signal generator 300 may also be an actuator, and the prompting information may be vibration information. In an example, the actuator may be a vibration motor, and the prompting information may be vibration of the shell 200, driven by the vibration motor at a predetermined frequency, of the terminal device 1000.

As illustrated in FIG. 29, in some implementations, when the signal generator 300 receives a preset turning-on instruction, the detection circuit 22 sends a turning-on control signal to turn on the laser light source ill again.

Figure 30:
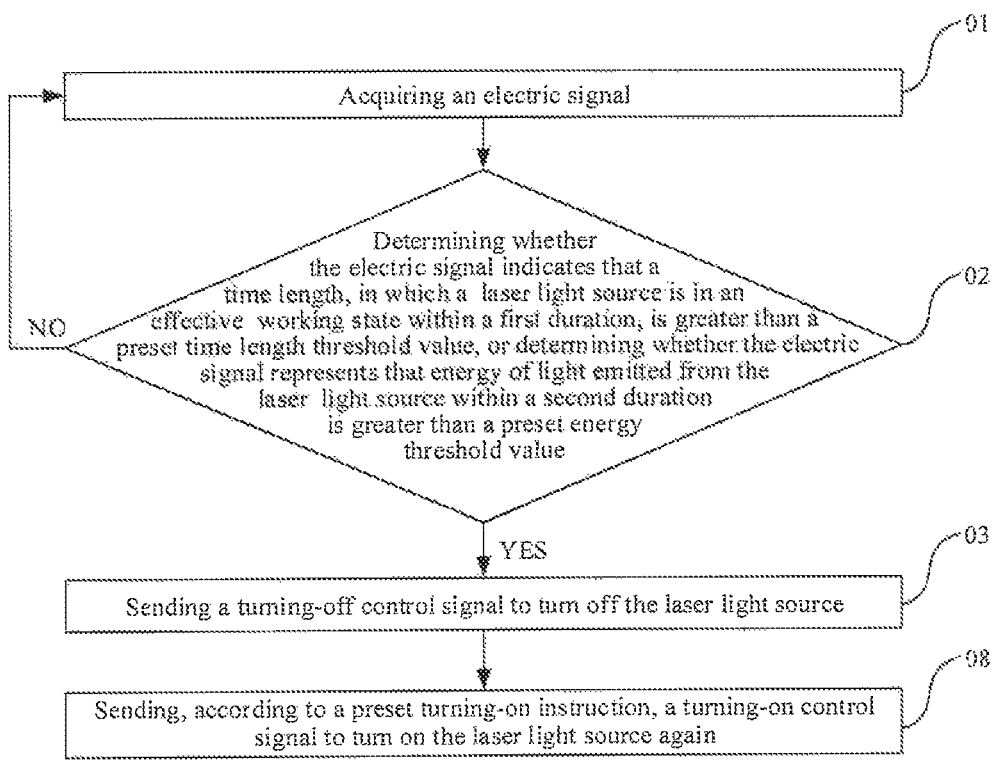
FIG. 30 and FIG. 31 are flowcharts of a control method for a TOF assembly according to some implementations of the disclosure.

In combination with FIG. 30, in some implementations, the control method for the TOF assembly 100 further includes operation 08. In operation 08, the turning-on control signal is sent, according to the preset turning-on instruction, to turn on the laser light source 111 again.

For example, as shown in FIG. 29, the display screen 301 may display prompting information "click to retry (10S)", the user may click the prompting information, the display screen 301, after receiving a click operation of the user, considers that the signal generator 300 receives the turning-on instruction, and in such case, the detection circuit 22 sends the turning-on control signal to turn on the laser light source 111 again. Of course, for different types of signal generators 300 and different prompting information, a type of the turning-on instruction may also be different. There are no limits made herein.

Figure 31:
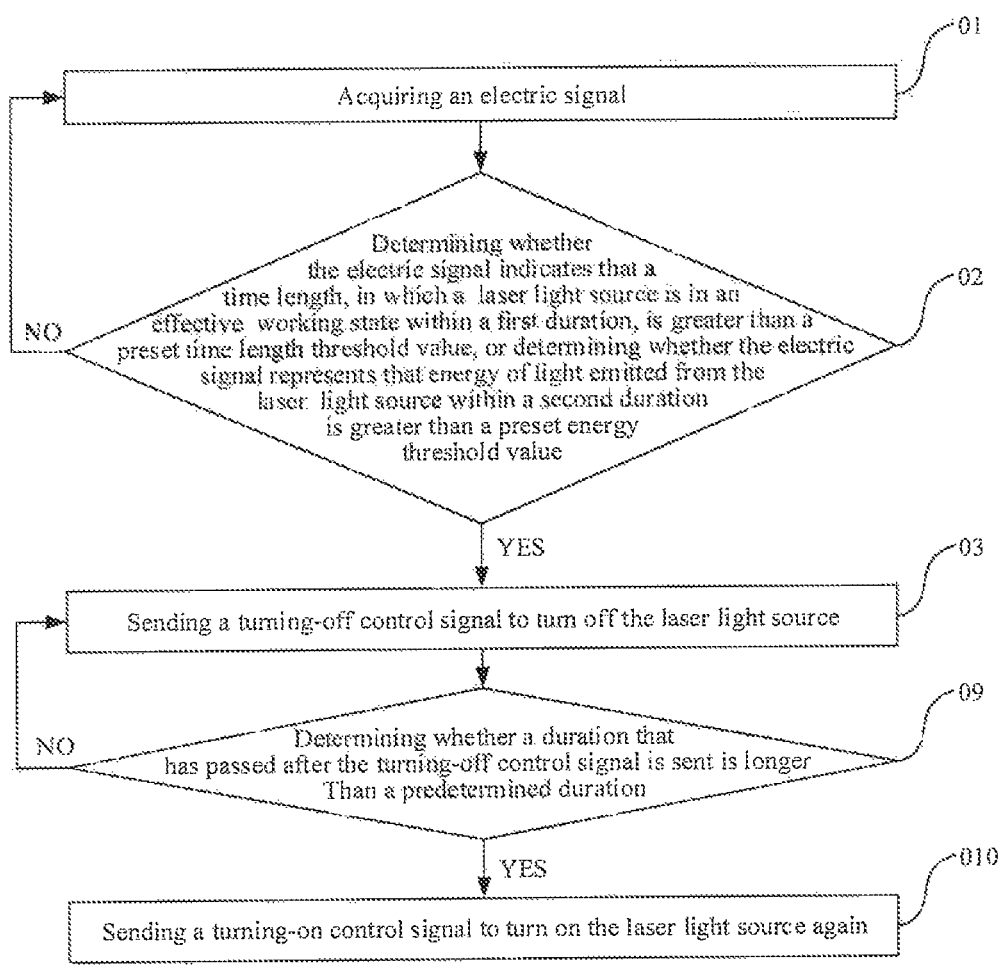

As illustrated in FIG. 31, in some implementations, the control method for the TOF assembly 100 further includes the following operations 09 and 010.

In operation 09, it is determined whether a time length that has passed after the turning-on control signal is sent is longer than a predetermined time length.

In operation 010, in response to the time length that has passed after the turning-on control signal is sent being longer than the predetermined time length, the turning-on control signal is sent to turn on the laser light source 111 again.

Specifically, the predetermined time length may be any time length such as 10 seconds, 7 seconds and 3 seconds. The terminal device 1000 may restart software related to the laser light source 111 or perform self inspection within the predetermined time length. The laser light source 111 is turned on after the predetermined time length to meet a using requirement of the user. Of course, when the time length that has passed after the turning-off control signal is sent is not longer than the predetermined time length, the laser light source 111 may be kept in an off state.

Furthermore, when a number of times that the laser light source 111 has been successively turned off exceeds a predetermined number of times, the laser light source 111 is constantly kept in the off state. After the laser light source 111 is turned off and turned on again, the detection circuit 22 may still detect that the TOF module 10 may not work normally and resend the turning-off control signal to turn off the laser light source 111 again. When the number of times that the laser light source 111 has been successively turned off exceeds the predetermined number of times, it is indicated that the TOF module 10 may have a hardware damage or a software failure difficult to recover and the TOF module 10 may be used normally only after being detected or maintained more comprehensively. Therefore, for ensuring safety of the user, the laser light source 111 is constantly kept in the off state and the laser light source 111 is prevented from being turned on accidentally.

In the descriptions of the specification, the descriptions made with reference to terms "certain implementations", "an implementation", "some implementations", "schematic implementation", "example", "specific example", "some examples" or the like refer to that specific features, structures, materials or characteristics described in combination with the implementations or the examples are included in at least one implementation or example of the disclosure. In the specification, these terms are not always schematically expressed for the same implementation or example. Moreover, the specific described features, structures, materials or characteristics may be combined in a proper manner in any one or more implementations or examples.

In addition, terms "first" and "second" are only adopted for description and should not be understood to indicate or imply relative importance or implicitly indicate the number of indicated technical features. Therefore, a feature defined by "first" and "second" may explicitly or implicitly indicate inclusion of at least one such feature. In the descriptions of the disclosure, "multiple" means at least two, for example, two and three, unless otherwise limited definitely and specifically.

The embodiments of the disclosure have been shown or described above. However, it can be understood that the abovementioned embodiments are exemplary and should not be understood as limits to the disclosure and those of ordinary skill in the art may make variations, modifications, replacements, transformations to the abovementioned embodiments within the scope of the disclosure. The scope of the disclosure is defined by the claims and equivalents thereof.

The invention claimed is:

1. A time of flight (TOF) assembly for controlling a laser light source to be turned off, comprising:
the laser light source;
one or more photo detectors, configured to receive light and convert the received light into a third electric signal, wherein a first electric signal converted from the light received by the one or more photo detectors is acquired before the laser light source is turned on, a second electric signal converted from the light received by the one or more photo detectors is acquired after the laser light source is turned on, and an amplitude of the first electric signal is subtracted from an amplitude of the second electric signal to obtain the third electric signal; and
a detection circuit, configured to send a turning-off control signal to turn off the laser light source, in response to the third electric signal indicating that a time length, in which the laser light source is in an effective working state within a first duration, is greater than a preset time length threshold value, or the third electric signal indicating that energy of light emitted from the laser light source within a second duration is greater than a preset energy threshold value,
wherein the TOF assembly further comprises an emission housing provided with a receiving cavity, wherein the laser light source is received in the receiving cavity; and
wherein the one or more detectors comprise a plurality of photo detectors, wherein at least one of the plurality of photo detectors is arranged in the receiving cavity and configured to, after the laser light source is turned on, receive infrared laser reflected by an optical element or an inner wall of the emission housing and light in an external environment to generate the second electric signal, and at least another one of the plurality of photo detectors is arranged outside the receiving cavity and configured to, before the laser light source is turned on, receive the light in the external environment to generate the first electric signal.

2. The TOF assembly of claim 1, wherein in response to the third electric signal indicating that a continuous time length, in which the laser light source is in the effective working state within the first duration, is greater than the preset time length threshold value, the detection circuit is configured to send the turning-off control signal to turn off the laser light source; or
in response to the third electric signal indicating that a total time length, in which the laser light source is in the effective working state within the first duration, is greater than the preset time length threshold value, the detection circuit is configured to send the turning-off control signal to turn off the laser light source.

3. The TOF assembly of claim 1, wherein the third electric signal having an amplitude greater than a first preset amplitude threshold value indicates that the laser light source is in the effective working state; or
the third electric signal having an amplitude less than a second preset amplitude threshold value indicates that the laser light source is in the effective working state.

4. The TOF assembly of claim 1, wherein when an integral of an amplitude of the third electric signal within the second duration is greater than a preset third threshold value, the third electric signal indicates that the energy of the light emitted from the laser light source is greater than the preset energy threshold value.

5. The TOF assembly of claim 1, further comprising an emission housing provided with a receiving cavity, wherein the laser light source is received in the receiving cavity, and the one or more photo detectors are received in the receiving cavity.

6. The TOF assembly of claim 5, wherein the photo detectors are arranged on an inner wall of the emission housing; or
the TOF assembly further comprises a substrate, and the photo detectors are arranged on the substrate.

7. The TOF assembly of claim 5, wherein a light absorption layer is arranged on an inner wall of the emission housing.

8. The TOF assembly of claim 5, wherein a light reflection layer is arranged on an inner wall of the emission housing.

9. The TOF assembly of claim 5, wherein a light condensing mechanism is arranged in the receiving cavity, and is used to condense light incident on the light condensing mechanism to the one or more photo detectors.

10. The TOF assembly of claim 5, wherein the one or more detectors comprise a plurality of photo detectors, at least two of the plurality of photo detectors being arranged to be symmetric about the laser light source.

11. The TOF assembly of claim 5, wherein the one or more detectors comprise a plurality of photo detectors; and
wherein one of the plurality of photo detectors is in a working state, or
at least two of the plurality of photo detectors are in the working state.

12. The TOF assembly of claim 1, further comprising a light filter member, wherein the light filter member is arranged on a light path of the light received by the one or more photo detectors.

13. The TOF assembly of claim 12, wherein a wavelength interval of light that can be transmitted through the light filter member matches a wavelength of laser light emitted by the laser light source.

14. The TOF assembly of claim 13, further comprising an emission housing provided with a receiving cavity and a light outlet, wherein the laser light source is received in the receiving cavity, the one or more photo detectors are received in the receiving cavity, and the light filter member covers the light outlet.

15. The TOF assembly of claim 1, further comprising an optical element, wherein the optical element is arranged on an emergent light path of the laser light source, and the one or more photo detectors are configured to receive laser light reflected by the optical element.

16. The TOF assembly of claim 15, wherein the optical element comprises a diffuser.

17. The TOF assembly of claim 1, wherein the time length threshold value or the energy threshold value is set according to at least one of: a distance between the TOF assembly and a target object; or
an intensity of ambient light.

18. A terminal device, comprising:
a shell; and
a time of flight (TOF) assembly, the TOF assembly being mounted in the shell,
wherein the TOF assembly comprises:
a laser light source;
one or more photo detectors, configured to receive light and convert the received light into a third electric signal, wherein a first electric signal converted from the light received by the one or more photo detectors is acquired before the laser light source is turned on, a second electric signal converted from the one or more light received by the photo detectors is acquired after the laser light source is turned on, and an amplitude of the first electric signal is subtracted from an amplitude of the second electric signal to obtain the third electric signal; and
a detection circuit, configured to send a turning-off control signal to turn off the laser light source, in response to the third electric signal indicating that a time length, in which the laser light source is in an effective working state within a first duration, is greater than a preset time length threshold value, or the third electric signal indicating that energy of light emitted from the laser light source within a second duration is greater than a preset energy threshold value,
wherein the TOF assembly further comprises an emission housing provided with a receiving cavity, wherein the laser light source is received in the receiving cavity; and
wherein the one or more detectors comprise a plurality of photo detectors, wherein at least one of the plurality of photo detectors is arranged in the receiving cavity and configured to, after the laser light source is turned on, receive infrared laser reflected by an optical element or an inner wall of the emission housing and light in an external environment to generate the second electric signal, and at least another one of the plurality of photo detectors is arranged outside the receiving cavity and configured to, before the laser light source is turned on, receive the light in the external environment to generate the first electric signal.

19. A control method for a time of flight (TOF) assembly, the TOF assembly comprising: an emission housing provided with a receiving cavity; and a laser light source and one or more photo detectors configured to receive light and convert the received light into a third electric signal, the control method comprising:

acquiring the third electric signal, wherein the one or more detectors comprise a plurality of photo detectors, a first electric signal converted from the light in an external environment received by at least one of the plurality of photo detectors arranged outside the receiving cavity is acquired before the laser light source is turned on, a second electric signal converted from the light received by at least another one of the plurality of photo detectors in the receiving cavity is acquired after the laser light source is turned on, and an amplitude of the first electric signal is subtracted from an amplitude of the second electric signal to obtain the third electric signal, the light received by the at least another one of the plurality of photo detectors in the receiving cavity comprising infrared laser reflected by an optical element or an inner wall of the emission housing and the light in the external environment;

determining whether the third electric signal indicates that a time length, in which the laser light source is in an effective working state within a first duration, is greater than a preset time length threshold value, or determining whether the third electric signal indicates that energy of light emitted from the laser light source within a second duration is greater than a preset energy threshold value; and in response to the third electric signal indicating that the time length is greater than the preset time length threshold value or the third electric signal indicating that the energy is greater than the preset energy threshold value, sending a turning-off control signal to turn off the laser light source.

\* \* \* \* \*